US012727493B2

(12) United States Patent
Komposch et al.

(10) Patent No.: US 12,727,493 B2
(45) Date of Patent: Sep. 1, 2026

(54) POWER PACKAGE HAVING CONNECTED COMPONENTS AND PROCESSES IMPLEMENTING THE SAME

(71) Applicant: WOLFSPEED, INC., Durham, NC (US)

(72) Inventors: Alexander Komposch, Morgan Hill, CA (US); Liew Soon Lee, Ipoh (MY); Eng Wah Woo, Ipoh (MY)

(73) Assignee: Wolfspeed, Inc., Durham, NC (US)

( * ) Notice: Subject to any disclaimer, the term of this patent is extended or adjusted under 35 U.S.C. 154(b) by 839 days.

(21) Appl. No.: 17/837,640

(22) Filed: Jun. 10, 2022

(65) Prior Publication Data

US 2023/0402360 A1 Dec. 14, 2023

(51) Int. Cl.

| | |
|---|---|
| ***H10W 70/65*** | (2026.01) |
| ***H10W 40/22*** | (2026.01) |
| ***H10W 70/68*** | (2026.01) |
| ***H10W 74/10*** | (2026.01) |

(52) U.S. Cl.

CPC ........... *H10W 70/65* (2026.01); *H10W 40/22* (2026.01); *H10W 70/68* (2026.01); *H10W 74/111* (2026.01)

(58) Field of Classification Search

CPC . H01L 21/561; H01L 23/49838; H01L 23/13; H01L 23/3107; H01L 23/367; H01L 23/49541; H01L 23/49562; H01L 23/49568; H01L 23/66; H01L 23/4334; H01L 24/26; H01L 25/16; H01L 25/0655; H01L 2223/6644; H01L 2223/6655

See application file for complete search history.

(56) References Cited

U.S. PATENT DOCUMENTS

| | | | |
|---|---|---|---|
| 5,953,593 A * | 9/1999 | Ferri | H01L 21/565 257/713 |
| 2013/0154068 A1* | 6/2013 | Sanchez | H01L 23/49541 438/122 |
| 2019/0109070 A1 | 4/2019 | Ho et al. | |
| 2021/0280478 A1 | 9/2021 | Wilson et al. | |
| 2021/0408979 A1* | 12/2021 | Komposch | H03F 3/195 |

FOREIGN PATENT DOCUMENTS

| | | |
|---|---|---|
| JP | 2008-016762 A | 1/2008 |
| KR | 10-1493866 B1 | 2/2015 |

OTHER PUBLICATIONS

International Patent Application No. PCT/US2023/068144; Int'l Search Report and the Written Opinion; dated Nov. 17, 2023; 11 pages.

* cited by examiner

*Primary Examiner* — Karen Kusumakar

(74) *Attorney, Agent, or Firm* — BakerHostetler

(57) ABSTRACT

A semiconductor package includes a metal submount; at least one transistor die arranged on said metal submount; and one or more metal contacts configured to be located adjacent said metal submount by a connection. The connection is configured as one of the following: a spot welded portion, a laser beam modified portion, a laser beam welded portion, an ultrasonic welded portion, an electric resistance welded portion, and a fused metal welded portion.

26 Claims, 24 Drawing Sheets

POWER PACKAGE HAVING CONNECTED COMPONENTS AND PROCESSES IMPLEMENTING THE SAME

FIELD OF THE DISCLOSURE

The disclosure relates to a power package having connected components. The disclosure further relates to processes implementing a power package having connected components.

BACKGROUND OF THE DISCLOSURE

A typical power package includes terminals, active devices, and a heat sink. The terminals are initially part of a lead frame strip. The typical connection method uses rivet technology to form connections with one or more rivets to combine the heat sink with the lead frame strip. The rivet consumes a great deal of space on a front side of the heat sink and reduces the amount of useable die attach area of the package. The thicker the heat sink, the more the rivet needs to be placed further inside the package, or toward the middle of the heat sink. This area inside the package cannot be used to place components such as the active devices. Additionally, the terminals have to be sized to avoid and/or have to be sufficiently spaced from a location of the rivet; and the active devices have to be sized proportional to the terminals. Accordingly, the rivets typically reduce the size of the terminals, reduce the size of the active devices, reduce the size of useable die attach area, and/or the like. Moreover, the rivet manufacturing process is time-consuming and the rivet manufacturing process costly.

Accordingly, what is needed is a package implementing component connections having more efficient use of space, a package implementing less costly manufacturing processes, a package implementing less time consuming manufacturing processes, and/or the like.

SUMMARY OF THE DISCLOSURE

One aspect includes a semiconductor package that includes a metal submount; at least one transistor die arranged on said metal submount; and one or more metal contacts configured to be located adjacent said metal submount by a connection, where the connection is configured as one of the following: a spot welded portion, a laser beam modified portion, a laser beam welded portion, an ultrasonic welded portion, an electric resistance welded portion, and a fused metal welded portion.

One aspect includes a semiconductor package that includes a metal submount; at least one transistor die arranged on said metal submount; and one or more metal contacts configured to be located adjacent said metal submount by a connection, where the one or more metal contacts are configured to be located adjacent said metal submount by a lead frame fused to the metal submount by the connection.

One aspect includes a process of implementing a semiconductor package that includes providing a metal submount; arranging at least one transistor die on said metal submount; configuring one or more metal contacts to be located adjacent said metal submount by a connection; and forming the connection as one of the following: a spot welded portion, a laser beam modified portion, a laser beam welded portion, an ultrasonic welded portion, an electric resistance welded portion, and a fused metal welded portion.

Additional features, advantages, and aspects of the disclosure may be set forth or apparent from consideration of the following detailed description, drawings, and claims. Moreover, it is to be understood that both the foregoing summary of the disclosure and the following detailed description are exemplary and intended to provide further explanation without limiting the scope of the disclosure as claimed.

BRIEF DESCRIPTION OF THE DRAWINGS

The accompanying drawings, which are included to provide a further understanding of the disclosure, are incorporated in and constitute a part of this specification, illustrate aspects of the disclosure and together with the detailed description serve to explain the principles of the disclosure. No attempt is made to show structural details of the disclosure in more detail than may be necessary for a fundamental understanding of the disclosure and the various ways in which it may be practiced. In the drawings.

DETAILED DESCRIPTION OF THE DISCLOSURE

Figure 1:
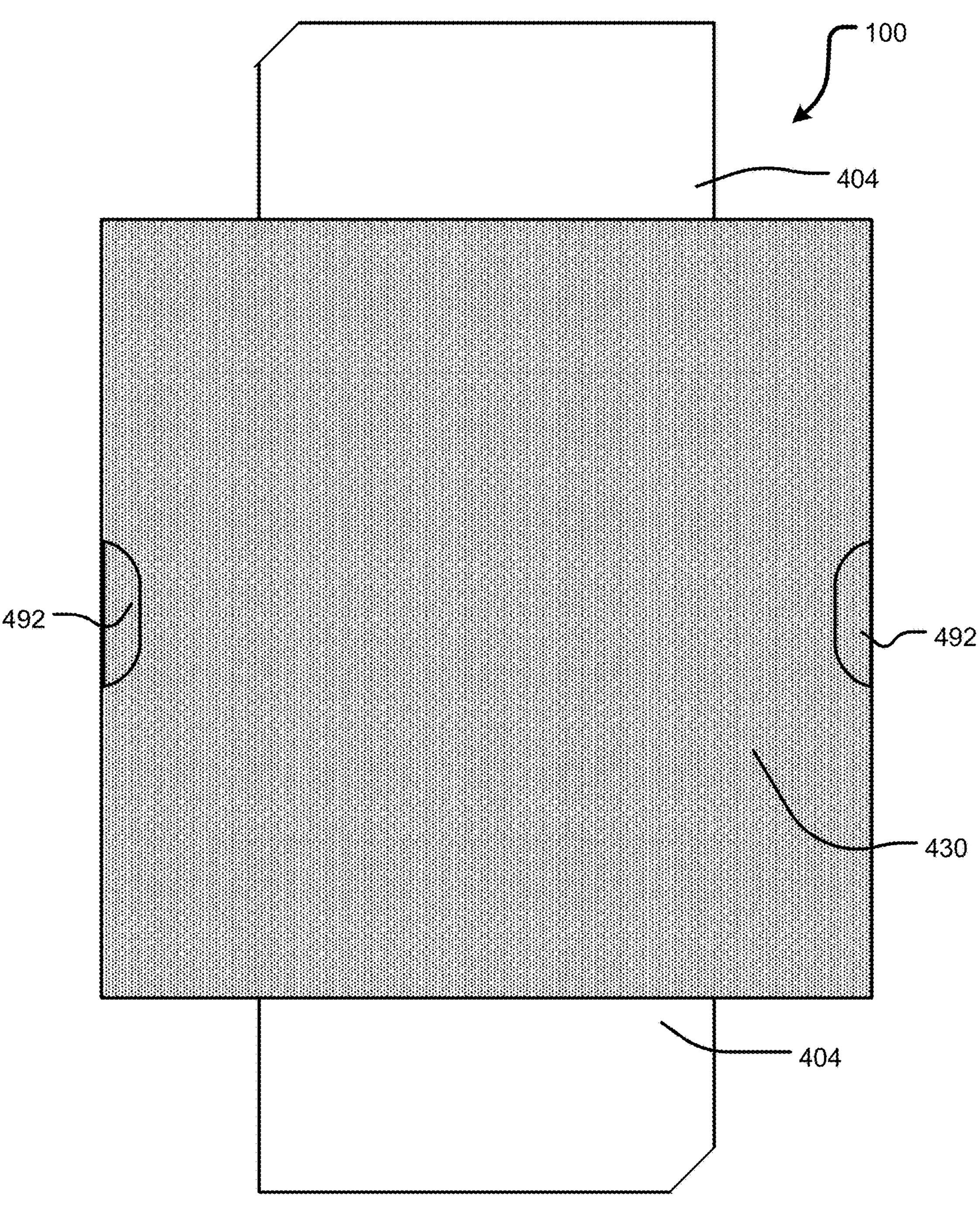
FIG. 1 illustrates a top view of a package according to the disclosure.

The aspects of the disclosure and the various features and advantageous details thereof are explained more fully with reference to the non-limiting aspects and examples that are described and/or illustrated in the accompanying drawings and detailed in the following description. It should be noted that the features illustrated in the drawings are not necessarily drawn to scale, and features of one aspect may be employed with other aspects, as the skilled artisan would recognize, even if not explicitly stated herein. Descriptions of well-known components and processing techniques may be omitted so as not to unnecessarily obscure the aspects of the disclosure. The examples used herein are intended merely to facilitate an understanding of ways in which the disclosure may be practiced and to further enable those of skill in the art to practice the aspects of the disclosure. Accordingly, the examples and aspects herein should not be construed as limiting the scope of the disclosure, which is defined solely by the appended claims and applicable law. Moreover, it is noted that like reference numerals represent similar parts throughout the several views of the drawings and in the different embodiments disclosed.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto another element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over another element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to another element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular aspects only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 14A:
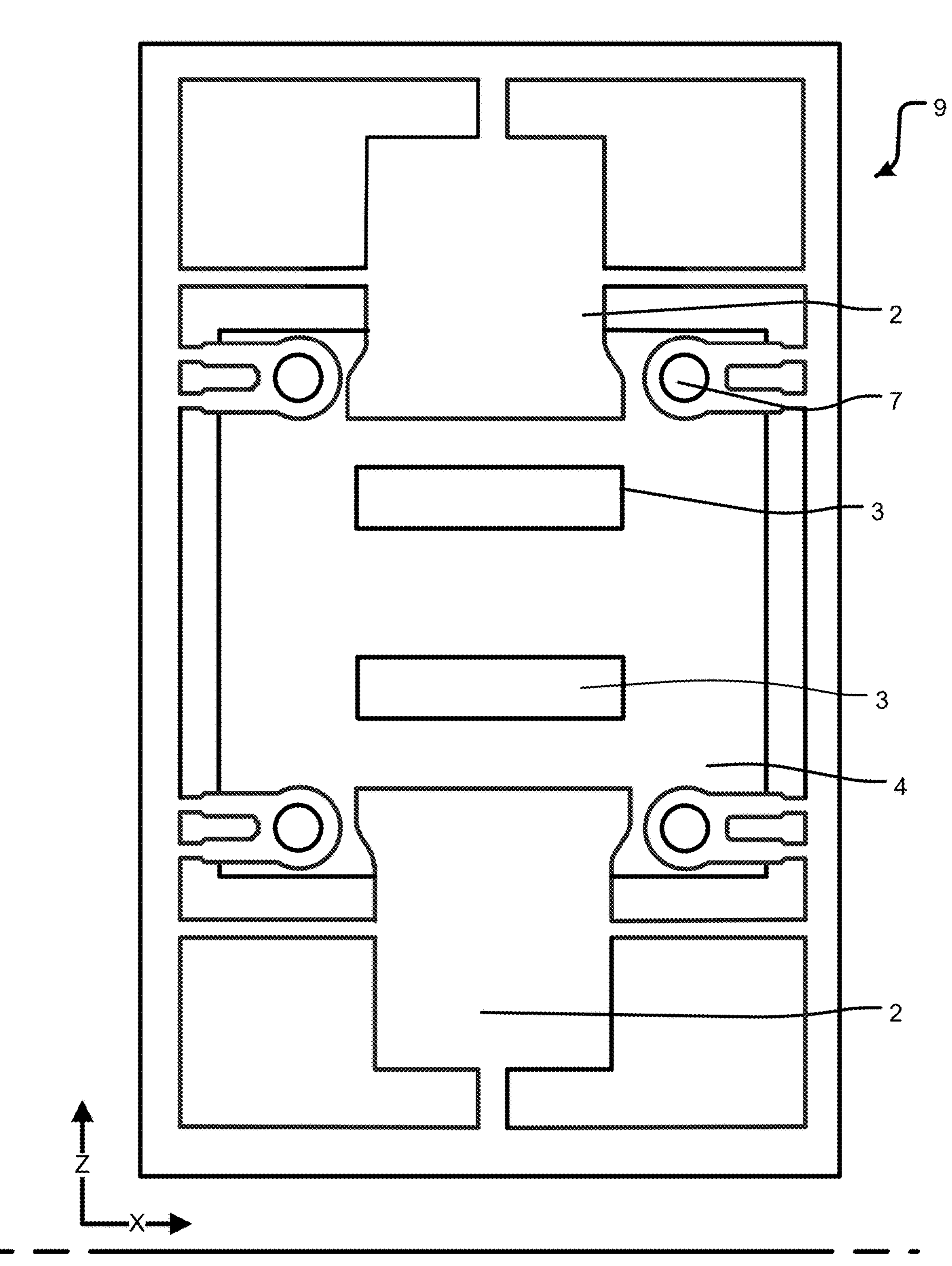
FIG. 14A illustrates a current implementation of a lead frame strip.

FIG. 14A illustrates a current implementation of a lead frame strip.

Figure 14B:
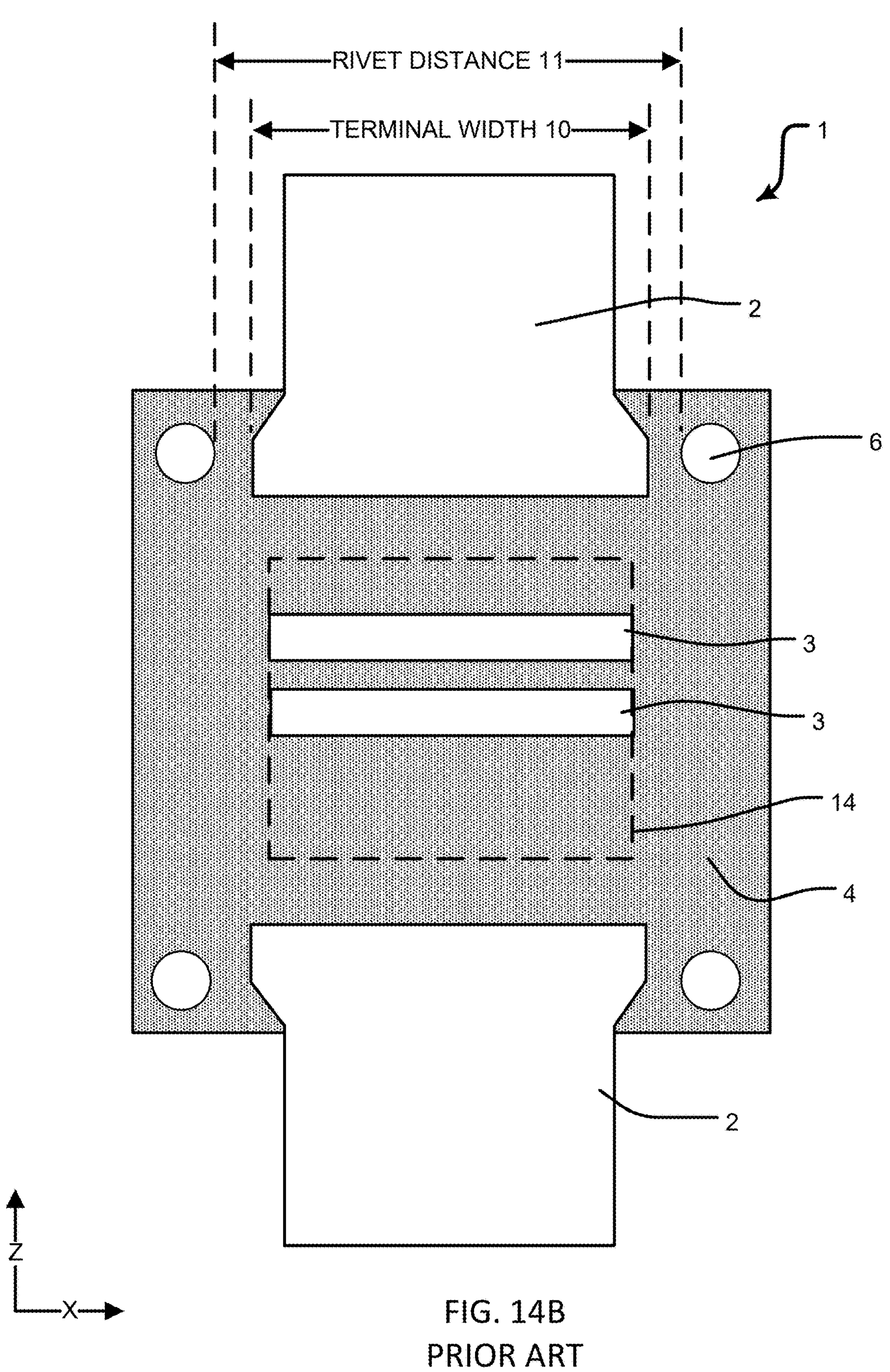
FIG. 14B illustrates a current implementation of a package utilizing the lead frame strip of FIG. 14A.

FIG. 14B illustrates a current implementation of a package utilizing the lead frame strip of FIG. 14A.

Figure 15A:
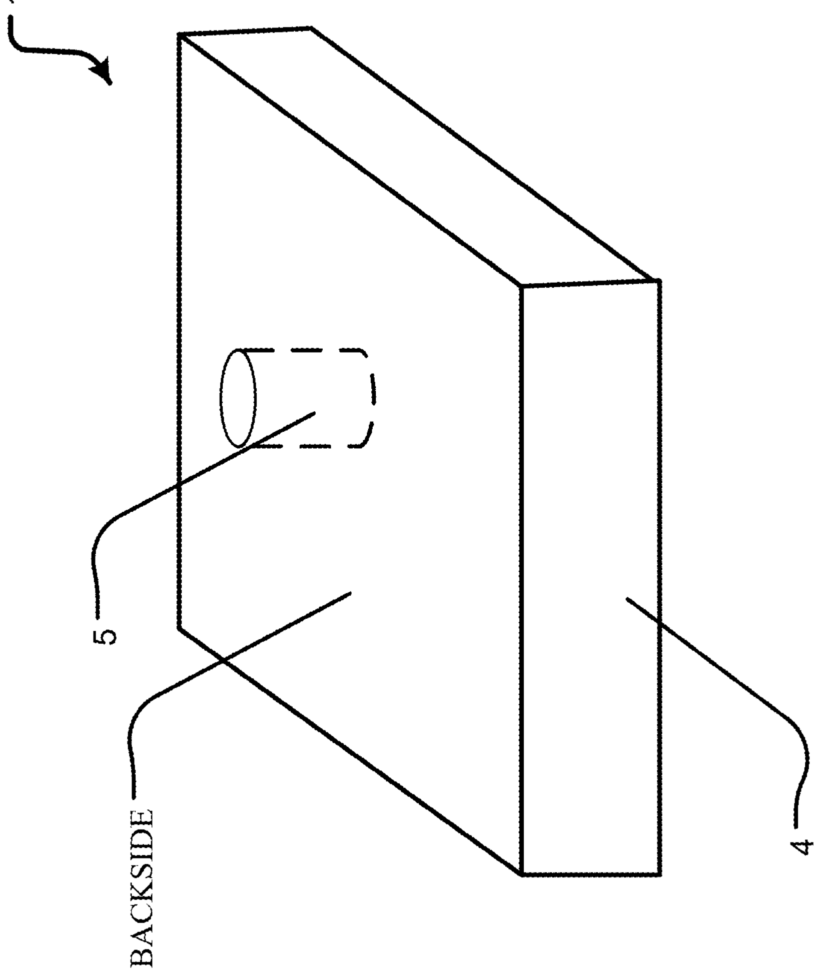
FIG. 15A and FIG. 15B illustrate steps to create connections of the current implementation of the package of FIG. 14A.
Figure 15B:
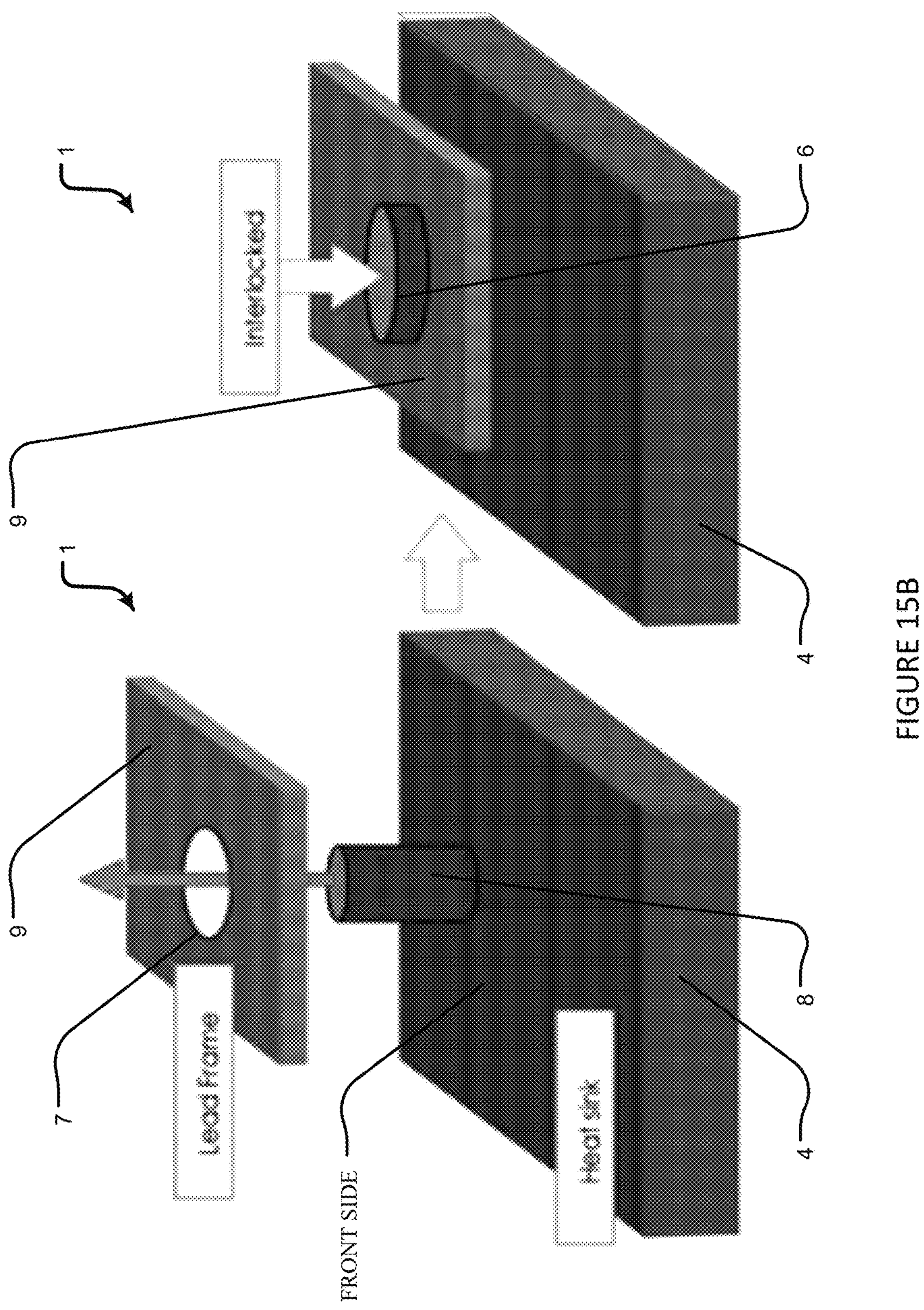

FIG. 15A and FIG. 15B illustrate steps to create connections of the current implementation of the package of FIG. 14A.

Figure 16:
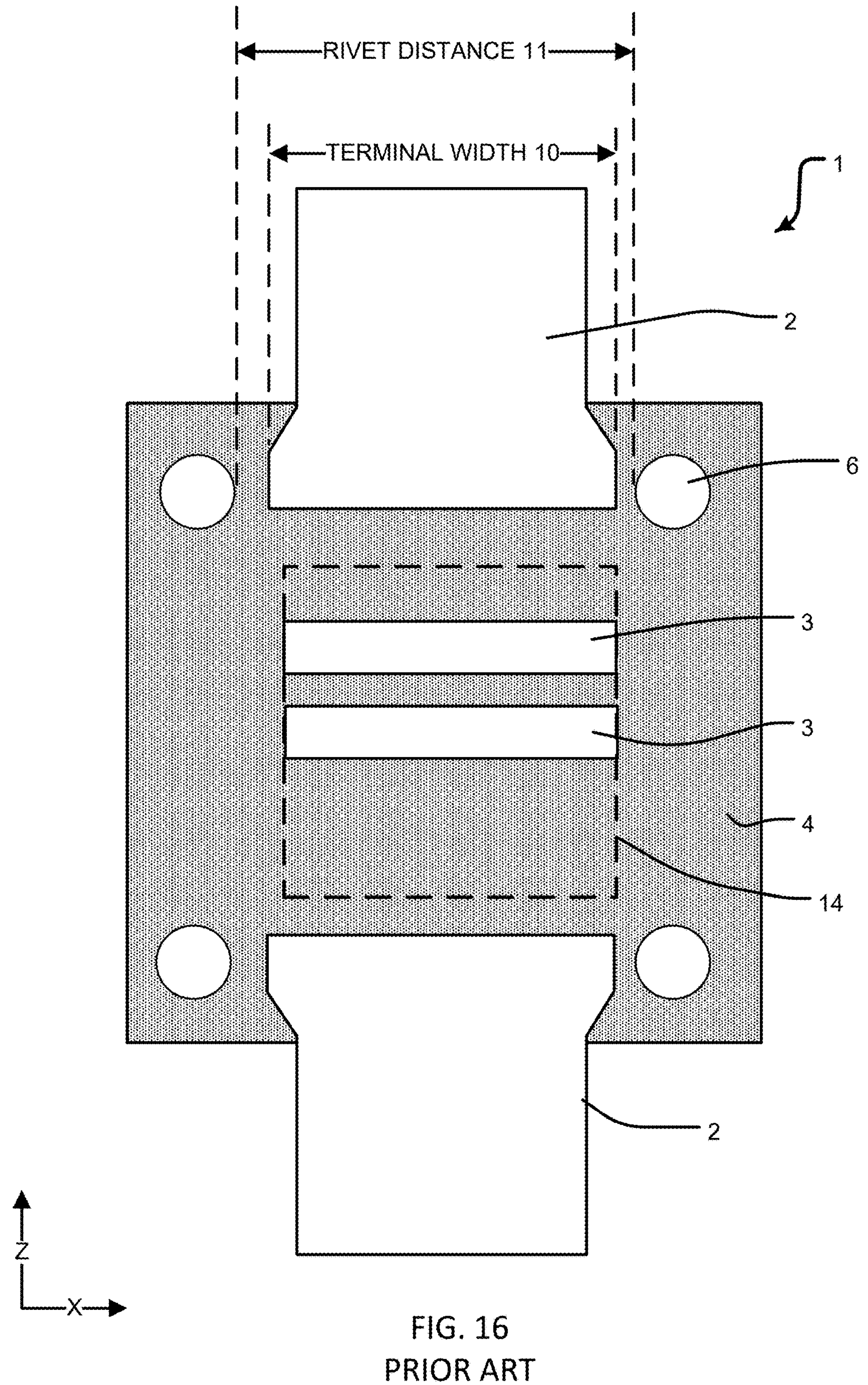
FIG. 16 illustrates another current implementation of a package.

FIG. 16 illustrates another current implementation of a package.

As illustrated in FIG. 14B, a current implementation of a current package 1 includes terminals 2, active devices 3 and passive devices, and a heat sink 4. The terminals 2 are initially part of a lead frame strip 9 as illustrated in FIG. 14A. The current package 1 uses rivet technology to form connections with a rivet 6 to combine the heat sink 4, (also referred to as a flange, a heat slug, a coin, and/or the like) with the lead frame strip 9 that includes the terminals 2. With reference to FIG. 15A and FIG. 15B, the steps to create these connections currently include: Punch a hole 5 into a backside of the heat sink 4 as illustrated in FIG. 15A to create a cylindrical protrusion 8 on a front side of the heat sink 4 as illustrated in the left image of FIG. 15B. The cylindrical protrusion 8 will then provide the material for the rivet 6 to rivet the lead frame strip 9 including the terminals 2 to the heat sink 4. The thicker the heat sink 4, the larger this hole and the corresponding implementation of the cylindrical protrusion 8, which requires a more robust tooling to create the cylindrical protrusion 8 on the front side of the heat sink 4. Accordingly, the thicker implementation of the heat sink 4 requires the cylindrical protrusion 8 and the resulting configuration of the rivet 6 to be larger and moved closer to the center of the heat sink 4 consuming yet more usable space on the heat sink 4. Next, position the lead frame strip 9 on the heat sink 4, which will currently be etched or stamped with a shape to include eyelets 7. The lead frame strip 9 will then be placed on top of the heat sink 4 with the cylindrical protrusion 8 extending through the eyelets 7. A tool will then be forced down on the cylindrical protrusion 8 to deform the cylindrical protrusion 8 and form a rivet 6 to rivet the lead frame strip 9 including the terminals 2 to the heat sink 4 as illustrated in the right image of FIG. 15B. This procedure that includes the rivet 6 consumes a great deal of space on the front side of the heat sink 4 and reduces the amount of useable die attach area of the current package 1. The thicker the heat sink 4, the thicker the punch tooling needs to be and the further inside the current package 1, or toward the middle of the heat sink 4, this rivet 6 will have to be placed. This area inside the current package 1 cannot be used to place components, such as the active devices 3. Additionally, the terminals 2 have to be sized to avoid a location of the rivet 6 to be electrically isolated from each other in the final product. In this regard and with reference to FIG. 14B, the terminals 2 have a terminal width 10 that is less than a rivet distance 11 that is a distance between inside surfaces of adjacent implementations of the rivet 6. Moreover, a width of the active devices 3, particularly power devices typically may be proportional to the terminal width 10. Accordingly, the current package 1 results in a useable die attach area 14 as illustrated in FIG. 14B.

With reference to FIG. 16, the current package 1 is implemented with a thicker implementation of the heat sink 4. Accordingly, the location of the rivet 6 is moved closer to a center of the heat sink 4, the terminal width 10 of the terminals 2 is reduced, the rivet distance 11 is reduced, and the useable die attach area 14 is reduced. Especially for small packages with ~1 mm thick implementations of the heat sink 4, this 'wasted' area, which is outside the useable die attach area 14 on the heat sink 4, becomes quite large compared to the useable area available for components (active area—the useable die attach area 14) on the heat sink 4 of the current package 1.

Figure 17:
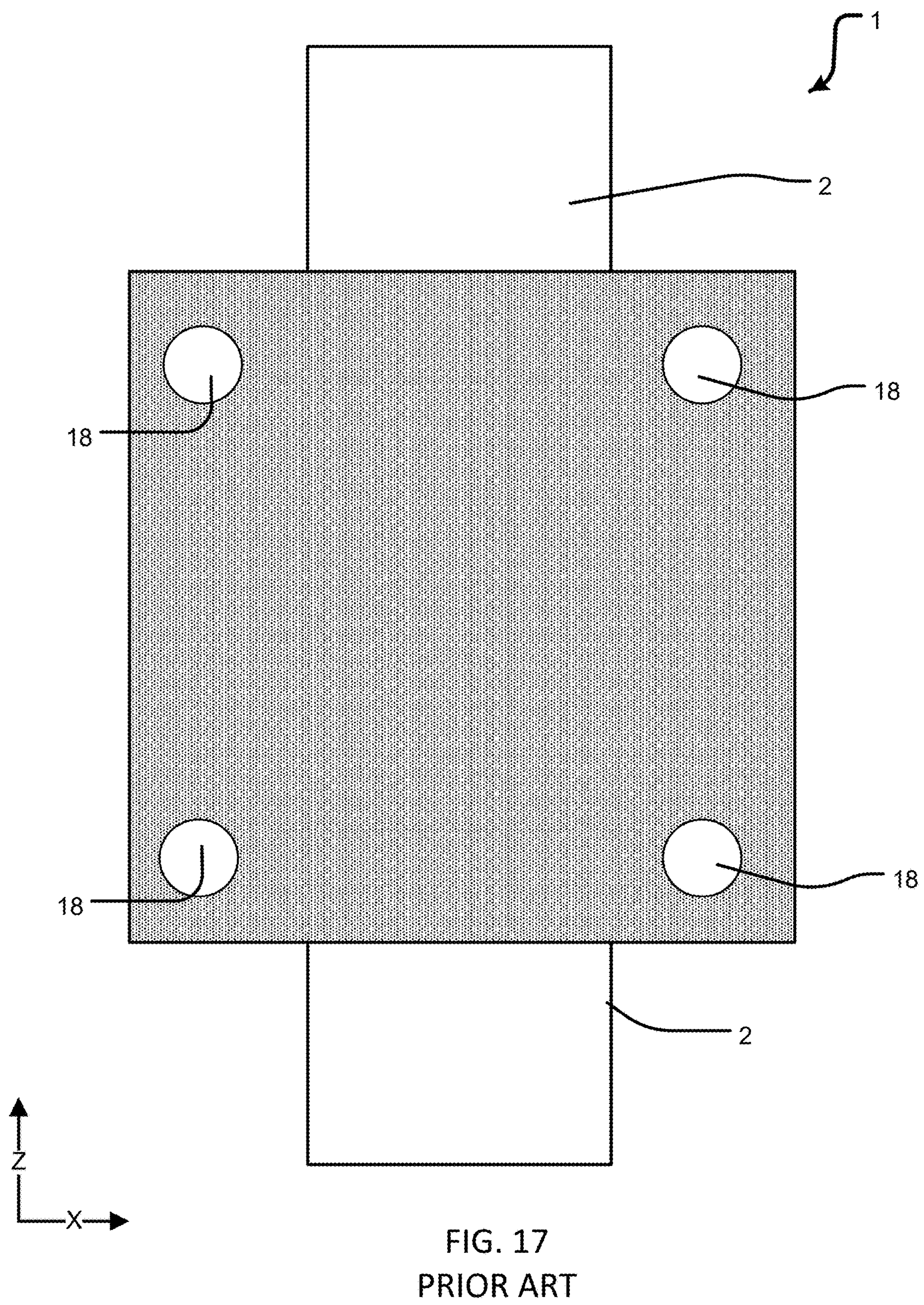
FIG. 17 illustrates another current implementation of a package.

FIG. 17 illustrates locations 18 where a pin clamp is located to hold down the current package 1 during molding. In particular, the pin clamp engages inside the package on top of the rivets 6. This need for locations 18 further limits the terminal width 10 of the terminals 2.

Figure 18:
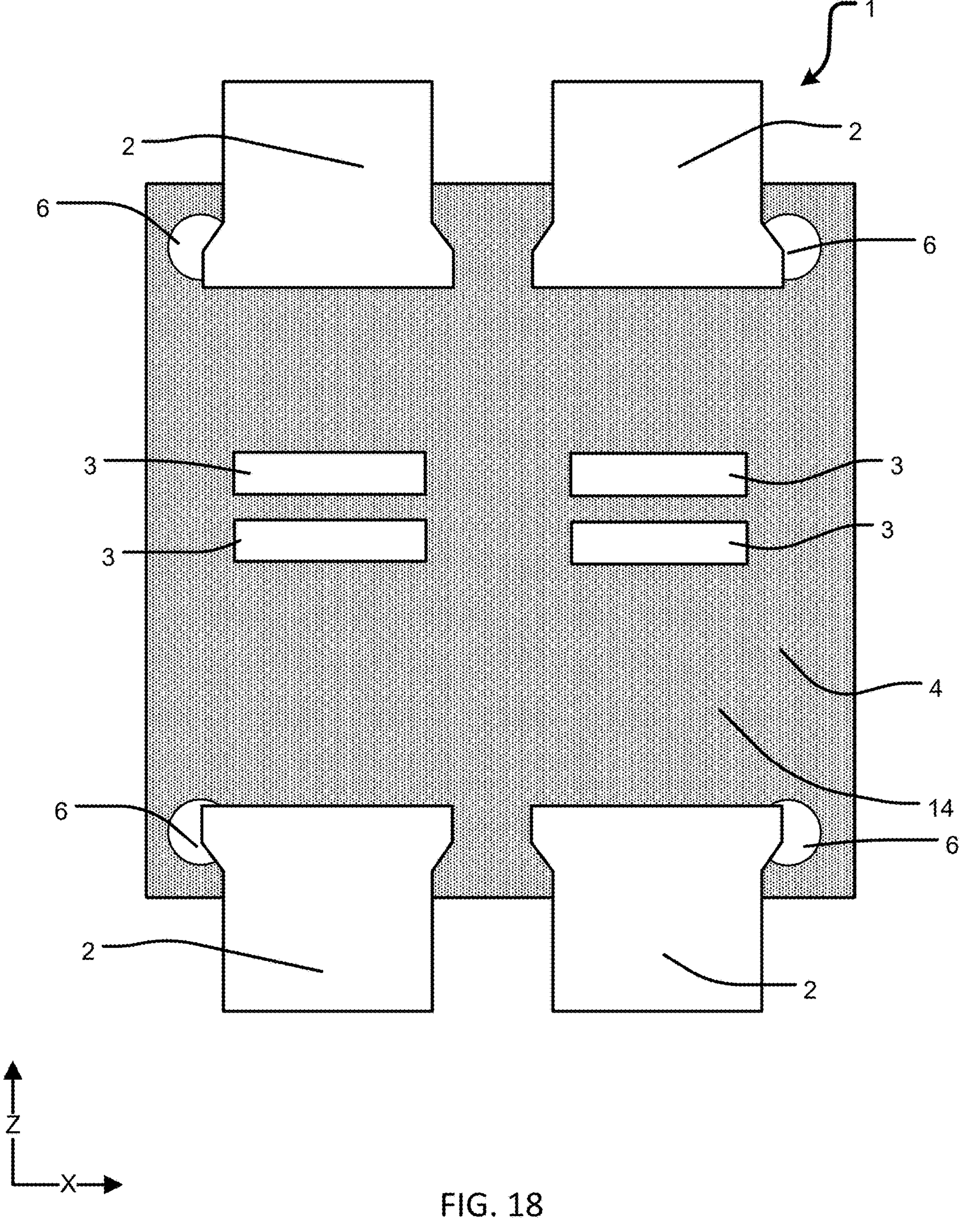
FIG. 18 illustrates implementation problems of a current implementation of a package.

FIG. 18 illustrates a visualization of implementation problems for the current package 1 when implemented as a push pull package. In this regard, a push pull package may include two of the terminals 2 on each side. As illustrated in FIG. 18, a push pull package would not be feasible as the location of the rivet 6 coincides with a location of the terminals 2.

In this regard, utilizing rivet technology as utilized in the current package 1 reduces the useable die attach area 14. Moreover, the rivet manufacturing process is time-consuming and the rivet manufacturing process costly.

The disclosure is directed to a device and method utilizing fabrication attach processes, such as spot welding, laser welding, ultrasonic welding, and/or the like to combine a heat sink to a lead frame. In this regard, a lead frame is a thin layer of metal that connects wiring from electrical terminals on the semiconductor surface to large-scale circuitry on electrical devices and circuit boards. Lead frames are used in almost all semiconductor packages. In aspects, the heat sink and the lead frame may have the same thickness or the heat sink and the lead frame have different thicknesses.

In particular, the disclosed device and method may combine a lead frame strip with a heat sink, coin, flange, and/or the like using the fabrication attach processes such as spot welding, laser welding, ultrasonic welding, and/or the like. This method may not need any preparations on the heat sink side-so no cylindrical protrusion is needed in preparation for the combination of those two materials.

In aspects, a small flag or overhang of the lead frame may be all that is needed for implementation of the fabrication attach processes, such as to have a small spot-welded connection between the lead frame and the heatsink. The small flag may also be changed for different lead frame configurations without changing a tooling to create the cylindrical protrusions as used in the current processes described above. All that may be needed is, for example, to change pin positions on spot welding tips.

Besides spot welding technology, the disclosed device and method can use laser spot welding which uses a laser to create a single spot to weld metal together. In this regard, using the fabrication attach processes such as spot welding, laser spot welding, ultrasonic welding, and/or the like will be more efficient and create more space in the die paddle area of the heat sink in comparison with current riveted package designs as described above.

In this regard, the useable space for die attach is proportional to a lead width and the device and method of the disclosure is advantageous in the use of the fabrication attach processes, such as spot welding technology, ultrasonic welding technology, laser welding technology, and/or the like to increase the usable space for die attach in comparison to packages implementing the current riveting method described above.

In this case, the disclosed device and method can gain approximately 40% more die attach area on the heatsink in some implementations, which translates directly to how much power can be implemented by the package. The disclosed device and method may also improve the efficiency of the package in regards to the useable die attach area versus overall package size.

The areas of spot welding can then also be used for a mold clamp to hold down the package during subsequent manufacturing, which is on a very outside of the package, which is more preferred than the cylindrical pin clamp inside the package on top of the rivets. Additionally, the aspects described herein may be implemented with a package that can also be utilized to combine lead frame materials to heat sinks for other types of semiconductor devices. In this regard, the disclosed device and method was implemented in response to difficulties in not having enough die attach area available, as the rivets of the current package could consume almost 50% of the total package size.

FIG. 1 illustrates a top view of a package according to the disclosure.

Figure 2:
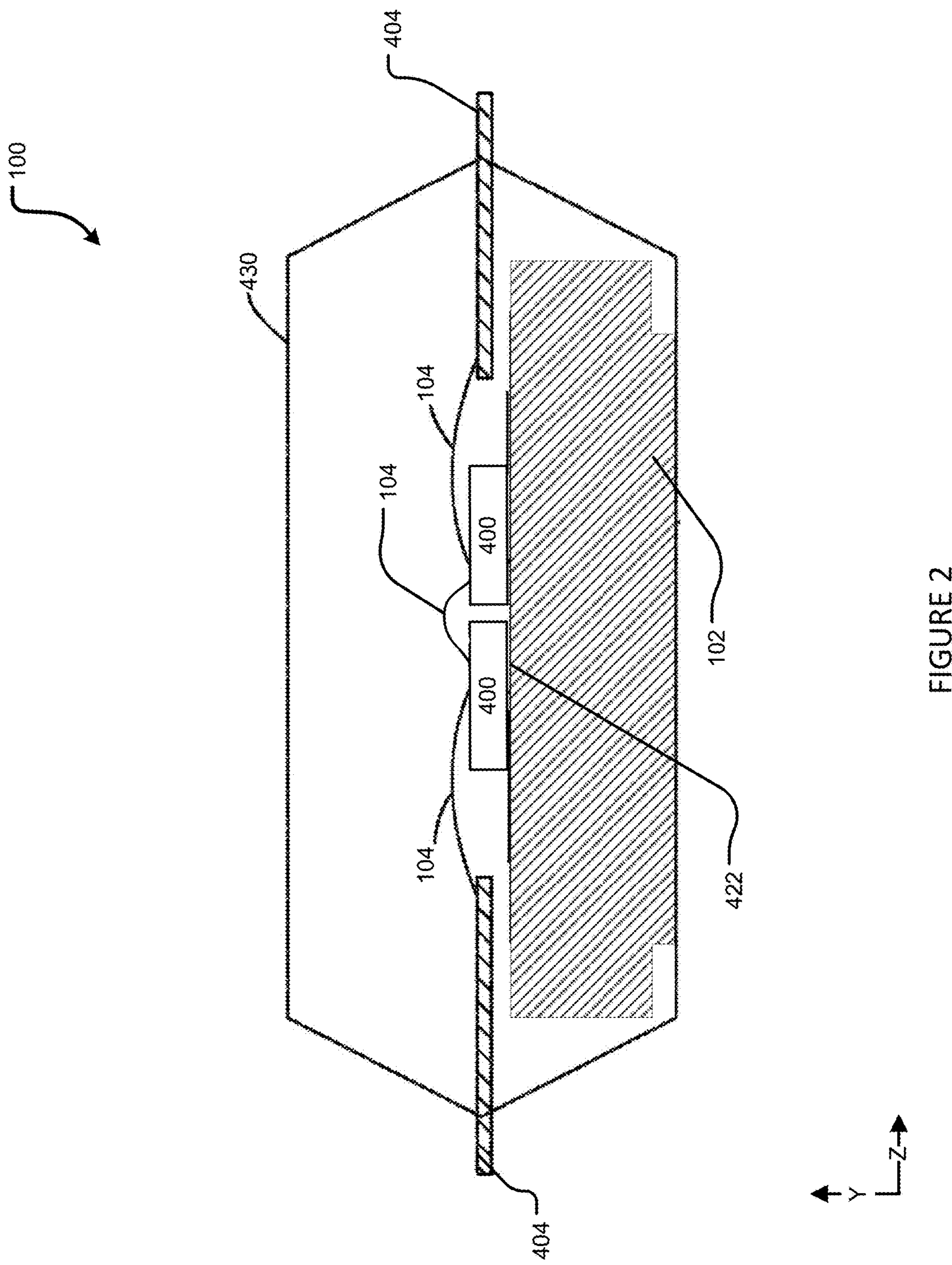
FIG. 2 illustrates a cross-sectional side view of the package according to FIG. 1.

FIG. 2 illustrates a cross-sectional side view of the package according to FIG. 1.

Figure 3:
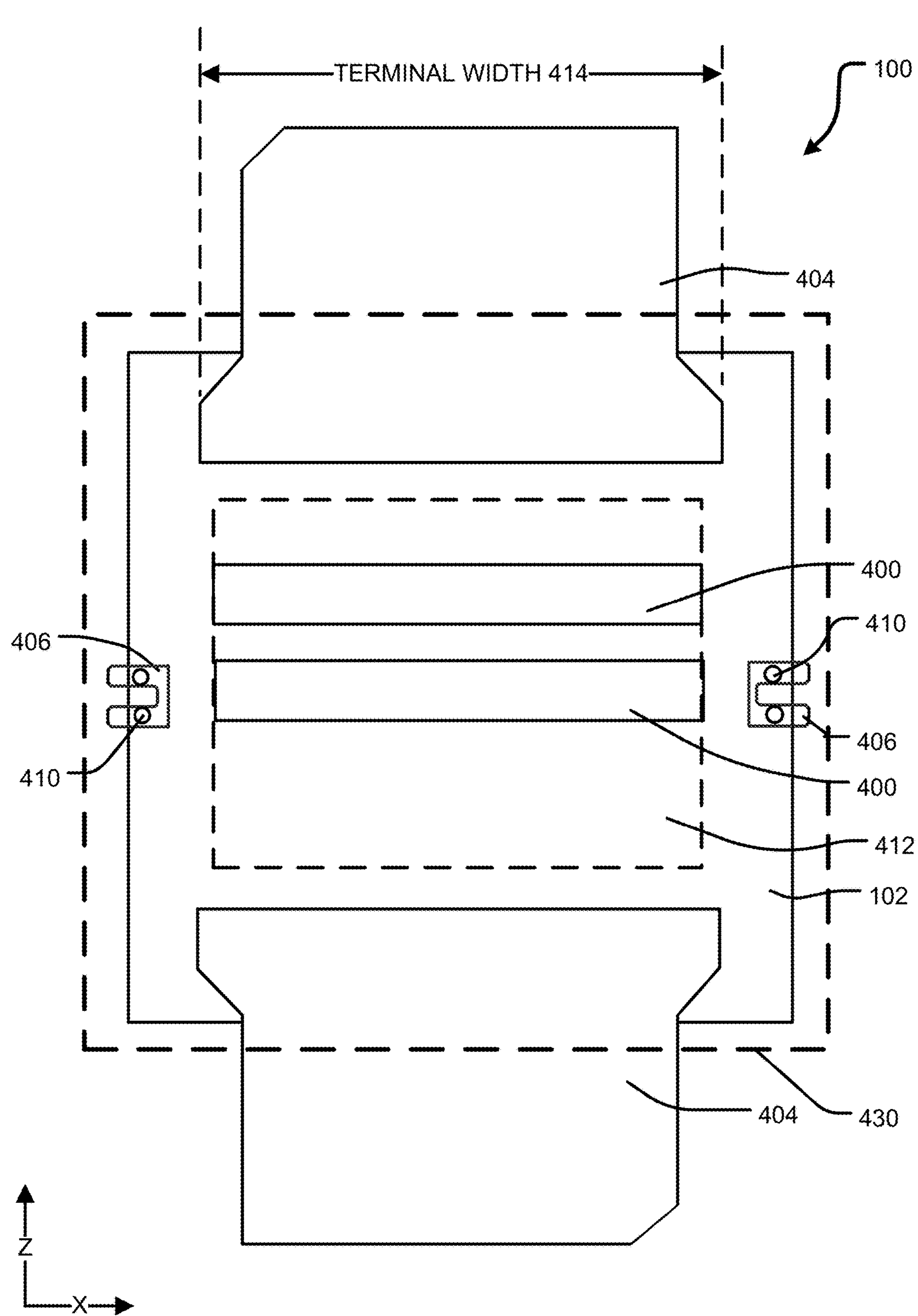
FIG. 3 illustrates a partial top view of a package according to FIG. 1.

FIG. 3 illustrates a partial top view of a package according to FIG. 1.

In particular, FIG. 1, FIG. 2, and FIG. 3 show an exemplary implementation of a package 100 that may be implemented as a power package, a radio frequency (RF) package, a RF transistor package, a RF power amplifier package, a RF power transistor package, a RF power amplifier transistor package, a semiconductor package, and/or the like as described herein. With reference to FIG. 1, the package 100 may include one or more metal contacts 404 and an overmold configuration 430.

With reference to FIG. 2, the package 100 may include one or more semiconductor devices 400, one or more interconnects 104, and a metal submount 102. The one or more interconnects 104 may couple the one or more semiconductor devices 400 to a first one of the one or more metal contacts 404, a second one of the one or more metal contacts 404, and and/or the like. Additionally, the one or more interconnects 104 may couple multiple implementations of the one or more semiconductor devices 400. Additionally, inside the package 100, the one or more semiconductor devices 400 may be arranged on the metal submount 102 via a die attach material 422.

FIG. 3 illustrates the package 100 without the one or more interconnects 104 and the overmold configuration 430 for clarity of illustration. FIG. 3 illustrates that the package 100 may include flag portions 406 that were initially part of a lead frame 408 as illustrated in FIG. 4. Additionally, as further described herein, the one or more metal contacts 404 are also part of the lead frame 408. The flag portions 406 that were initially part of the lead frame 408 have been configured to form a connection 410 to the metal submount 102. In other words, the connection 410 is formed to attach the lead frame 408 as well as the flag portions 406 and the one or more metal contacts 404 to the metal submount 102 during manufacturing of the package 100 as further described herein.

Figure 4A:
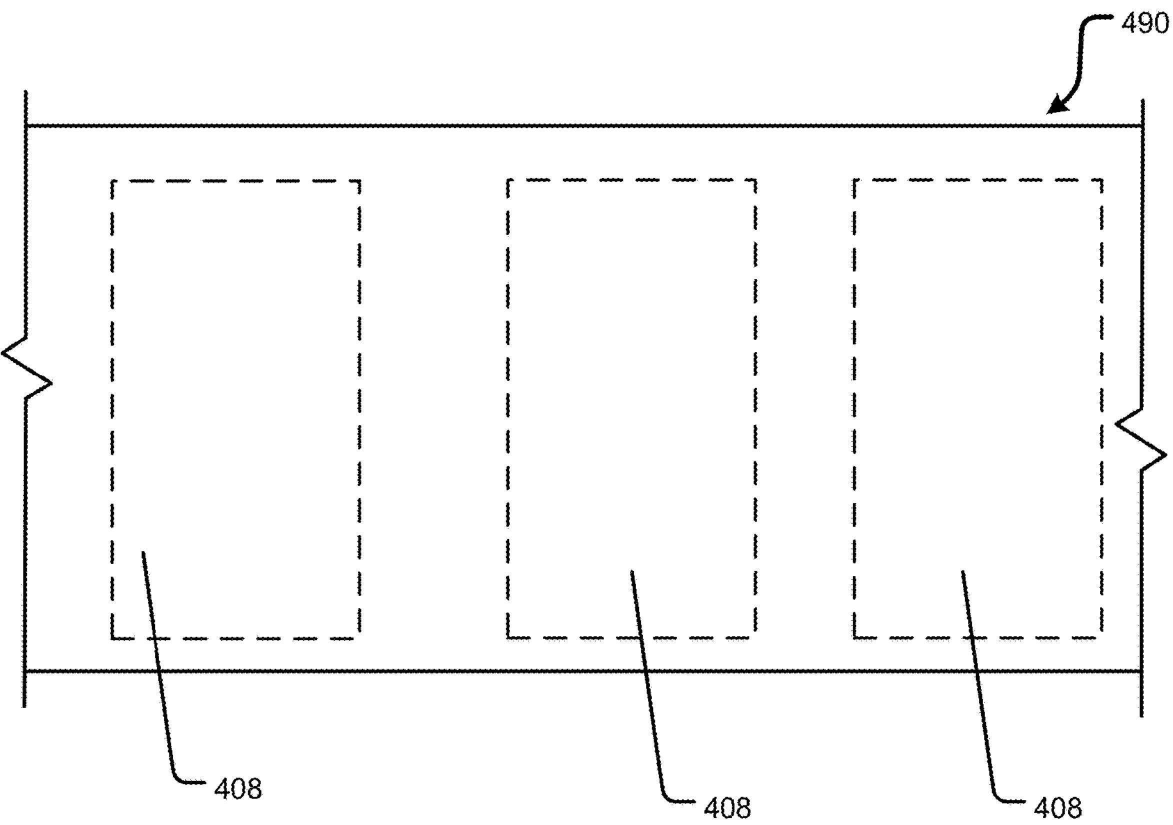
FIG. 4A, FIG. 4B, and FIG. 4C are top views of the lead frame strip according to an aspect of the disclosure.
Figure 4A:
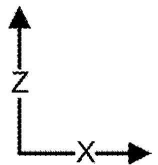
Figure 4B:
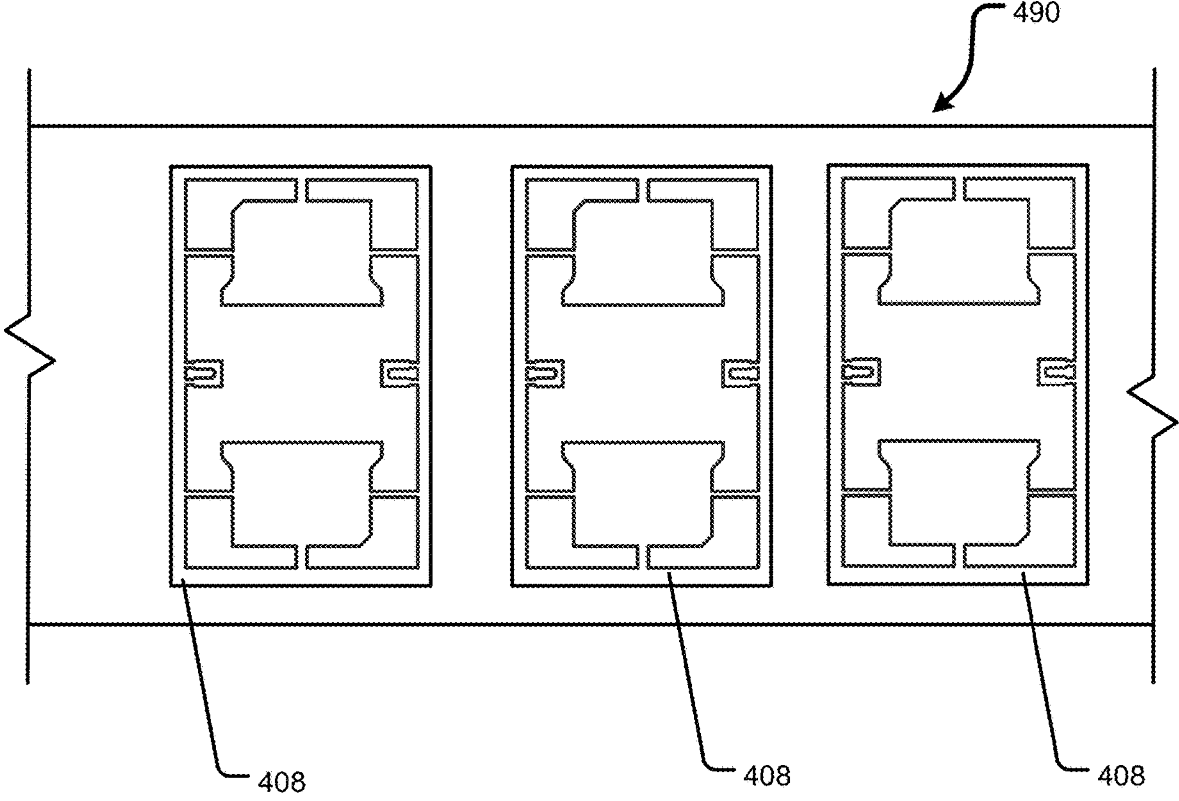
Figure 4B:
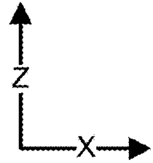
Figure 4C:
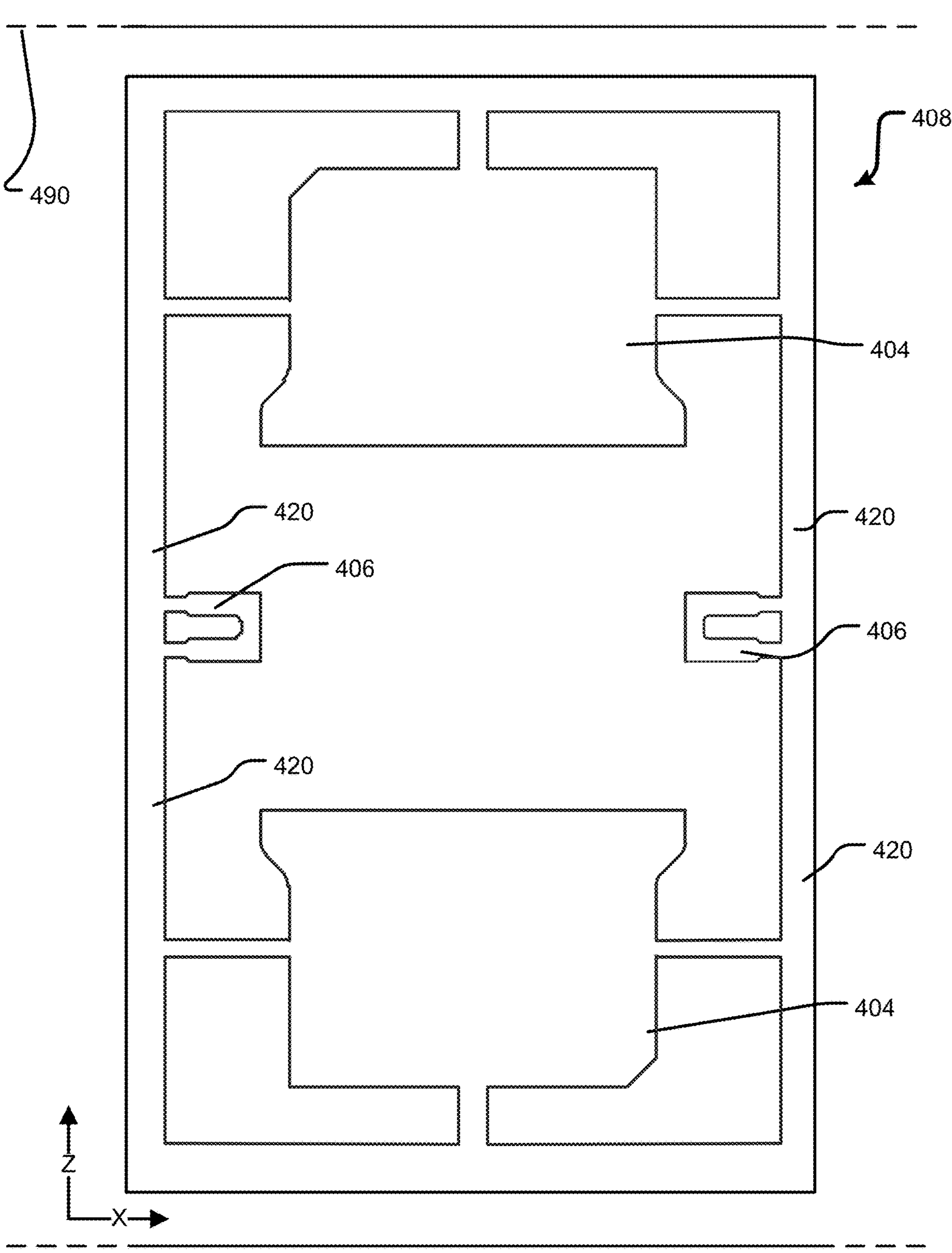

FIG. 4A, FIG. 4B, and FIG. 4C are top views of the lead frame strip according to an aspect of the disclosure.

Figure 5A:
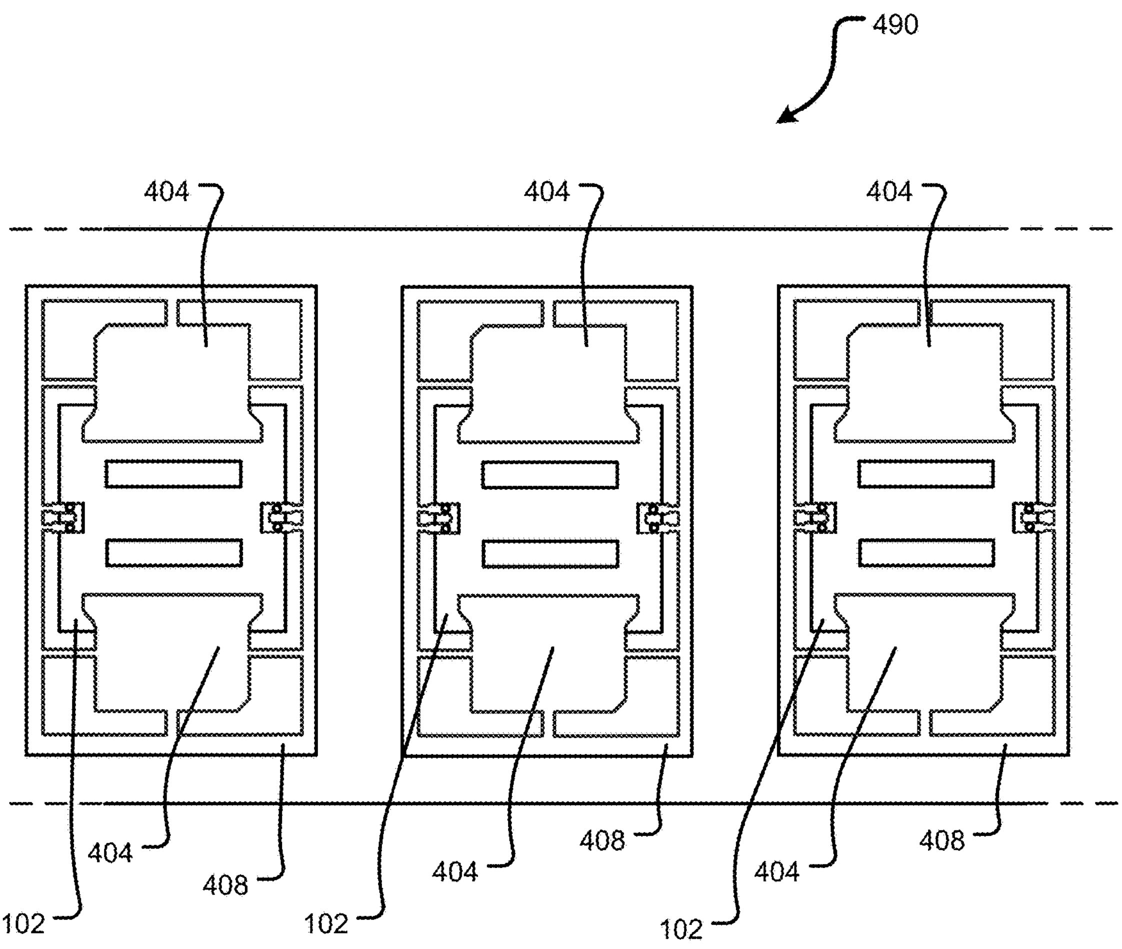
FIG. 5A and FIG. 5B are top views of the package during an intermediate manufacturing process according to aspects of the disclosure.
Figure 5A:
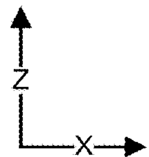
Figure 5B:
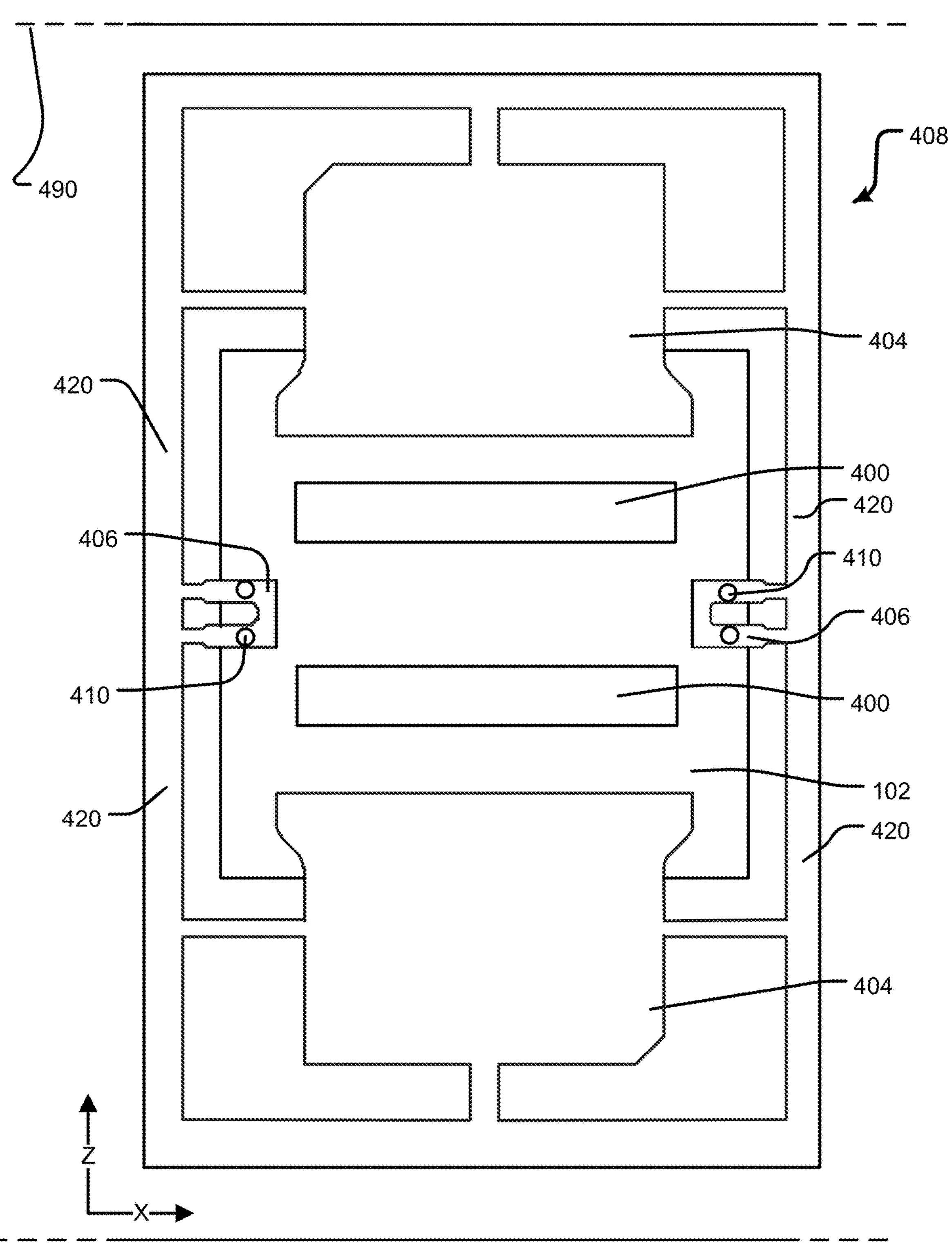

FIG. 5A and FIG. 5B are top views of the package during an intermediate manufacturing process according to aspects of the disclosure.

Figure 6A:
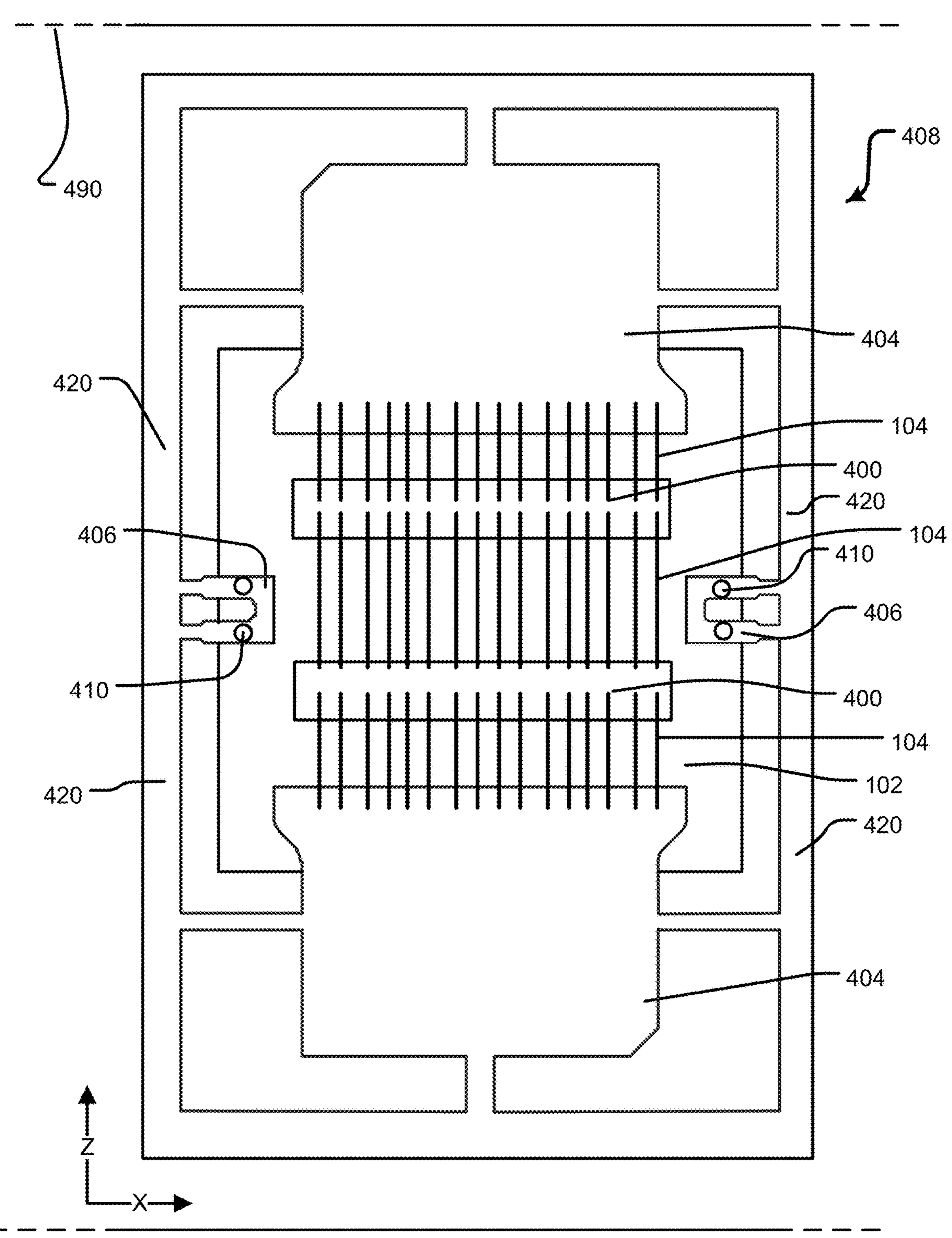
FIG. 6A is a top view of the package during an intermediate manufacturing process according to aspects of the disclosure.

FIG. 6A is a top view of the package during an intermediate manufacturing process according to aspects of the disclosure.

Figure 6B:
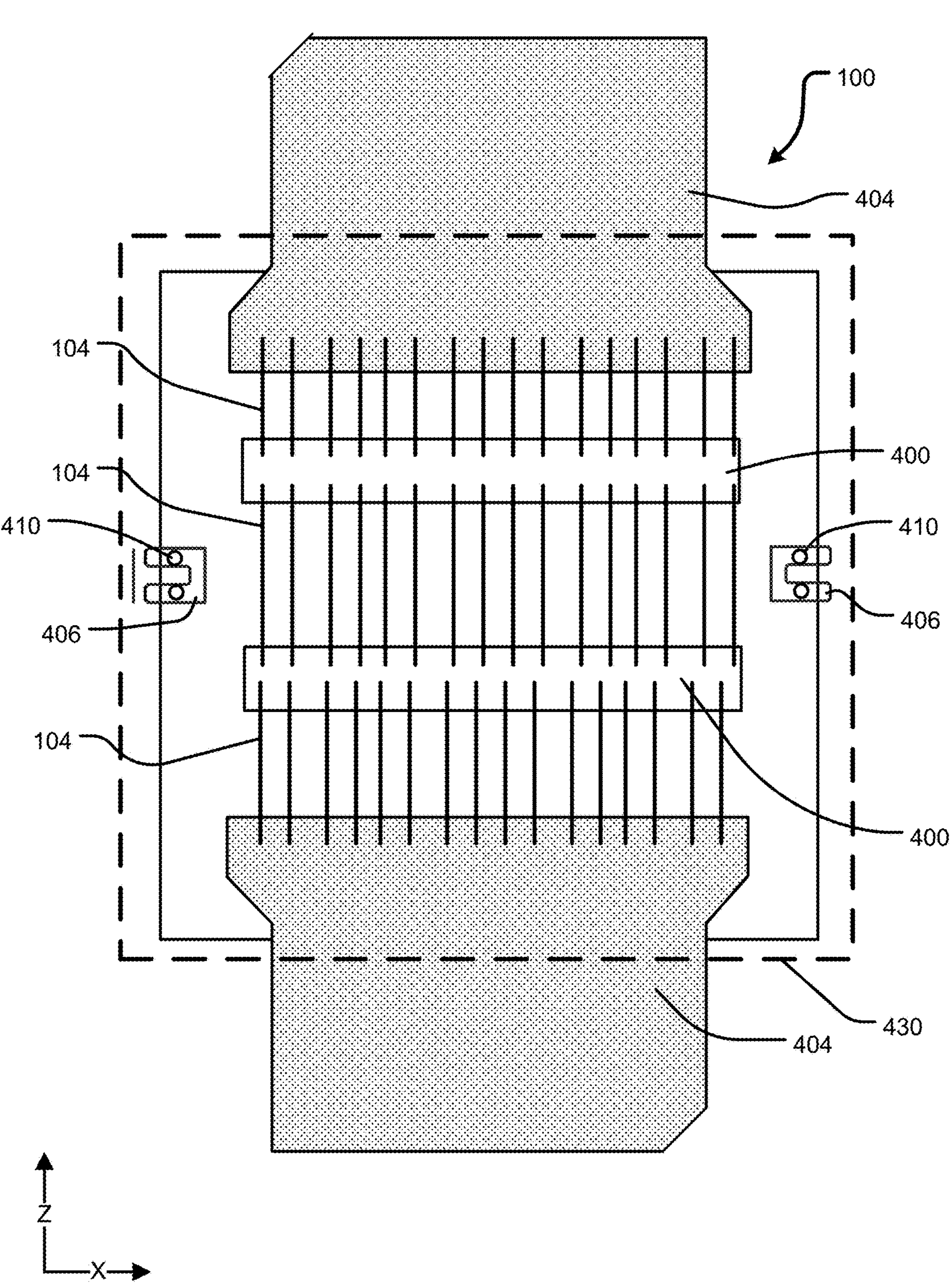
FIG. 6B is a top view of the package according to aspects of the disclosure.

FIG. 6B is a top view of the package according to aspects of the disclosure.

In particular, FIG. 4A is a top view of a strip of material that will form a lead frame strip 490. In this regard, the strip of material illustrated in FIG. 4A may be subsequently processed to form the lead frame strip 490 with a plurality of portions of the lead frame 408 as further described herein.

FIG. 4B is a top view of the lead frame strip 490 after further processing illustrating a plurality of portions of the lead frame 408. FIG. 4C illustrates a single one of the plurality of portions of the lead frame 408 of the lead frame strip 490 for ease of illustration. In this regard, the lead frame strip 490 illustrated in FIG. 4C may include a plurality of portions of the lead frame 408 as shown by the dashed lines.

The lead frame 408 may include the one or more metal contacts 404, the flag portions 406, and lead frame portions 420. The lead frame portions 420 may initially connect the flag portions 406 to the one or more metal contacts 404. In particular, during manufacturing of the package 100, the lead frame 408 may be constructed with the one or more metal contacts 404, the flag portions 406, and the lead frame portions 420. In this regard, the lead frame 408 may be constructed from a strip of metal material that is processed to form the lead frame strip 490 with the one or more metal contacts 404, the flag portions 406, and the lead frame portions 420. More specifically, the lead frame strip 490 may be stamped, punched, etched, and/or the like to form the lead frame 408, the one or more metal contacts 404, the flag portions 406, and the lead frame portions 420 from a metal strip. In this regard, the lead frame strip 490 that may have a plurality of the lead frame 408 may be formed with an open space between the implementations of the one or more metal contacts 404, the lead frame portions 420, and/or the flag portions 406 as illustrated in FIG. 4B. Additionally, the flag portions 406 may be configured as tabs, extensions, portions, and/or the like.

Moreover, the lead frame 408 including the flag portions 406, the one or more metal contacts 404, and/or the like illustrated in FIG. 4C is merely exemplary. In this regard, the lead frame 408 including the flag portions 406, the one or more metal contacts 404, and/or the like may take any desired form depending on the application and/or implementation the package 100. Additionally, the lead frame strip 490 may include a plurality of the lead frame 408 for forming a plurality of the package 100. In this regard, the lead frame strip 490 may extend with multiple implementations of the lead frame 408 in one or both of the X axis as illustrated in FIG. 4B and/or the Z axis as illustrated in FIG. 4B for manufacturing a plurality of the package 100.

As illustrated in FIG. 5A, the lead frame strip 490 that may have a plurality of portions of the lead frame 408 may thereafter be arranged on a plurality of portions of the metal submount 102. FIG. 5B illustrates a single one of the plurality of portions of the lead frame 408 of the lead frame strip 490 and one of the plurality of portions of the metal submount 102 for ease of illustration. In this regard, the connection 410 for each may be formed to connect the one or more metal contacts 404 of the lead frame 408 and the flag portions 406 of the lead frame 408 to the metal submount 102. In particular, the connection 410 may be formed to connect the one or more metal contacts 404 of the lead frame 408 and the flag portions 406 of the lead frame 408 to the metal submount 102 utilizing fabrication attach processes. The fabrication attach processes will be further described below. In aspects, the one or more metal contacts 404 are configured to be located within the package 100 by the lead frame 408 of the lead frame strip 490 being attached to the metal submount 102 by the connection 410.

As illustrated in FIG. 6A, the one or more semiconductor devices 400 may be arranged on the metal submount 102, the one or more interconnects 104 may be attached to the one or more semiconductor devices 400 and/or the one or more metal contacts 404. Thereafter as illustrated in FIG. 6B, the overmold configuration 430 (shown as transparent with dashed lines for clarity of illustration) may be arranged on one or more of the metal submount 102, the one or more interconnects 104, the one or more semiconductor devices 400, and/or the like. Thereafter, portions of the lead frame strip 490 and/or the lead frame 408 such as the lead frame portions 420 illustrated in FIG. 6A may be removed from the lead frame strip 490 and/or the lead frame 408 leaving the one or more metal contacts 404 and the flag portions 406 as part of the package 100 as illustrated in FIG. 6B.

The disclosed implementation of the package 100 and associated method may manufacture the lead frame strip 490 as illustrated in FIG. 4A. Thereafter, the lead frame strip 490 may be etched, cut, and/or the like to form the lead frame 408 as illustrated in FIG. 4B and FIG. 4C.

Thereafter, the disclosed implementation of the package 100 and associated method may combine the lead frame strip 490 and/or the lead frame 408 with the metal submount 102 as illustrated in FIG. 5A and FIG. 5B such that the lead frame strip 490 and/or the lead frame 408 may be attached to the metal submount 102 by the connection 410.

Thereafter, the disclosed implementation of the package 100 and associated method may attach the one or more semiconductor devices 400 to the metal submount 102 as illustrated in FIG. 5A and FIG. 5B. During the attachment of the one or more semiconductor devices 400 to the metal submount 102 as illustrated in FIG. 5A and FIG. 5B, the one or more metal contacts 404 and the flag portions 406 may be still attached to the lead frame strip 490 and/or the lead frame 408 with the lead frame portions 420.

Thereafter, the one or more interconnects 104 may be connected between the one or more metal contacts 404 and the one or more semiconductor devices 400, such as by wire bonding, as illustrated in FIG. 6A. As further illustrated in FIG. 6A, the one or more metal contacts 404 and the flag portions 406 may be still attached to the lead frame strip 490 and/or the lead frame 408 with the lead frame portions 420.

Thereafter, the disclosed implementation of the package 100 and associated method may form the overmold configuration 430 and the lead frame strip 490 and/or the lead frame 408 may then be trimmed such that the one or more metal contacts 404 and the flag portions 406 may be separated from the lead frame strip 490 and/or the lead frame 408 into individual packages or units of the package 100. This electrically separates the one or more metal contacts 404 from the lead frame strip 490 and/or the lead frame 408 as well as the flag portions 406 as illustrated in FIG. 6B.

The disclosed implementation of the package 100 and associated method may utilize various technologies to form the connection 410 between the lead frame 408 and the metal submount 102. In particular, the connection 410 between the lead frame strip 490 and/or the lead frame 408 and the metal submount 102 may be formed utilizing the fabrication attach processes that may include various welding fabrication processes and/or the like. In aspects, the connection 410 between the lead frame 408 and the metal submount 102 may be formed utilizing the fabrication attach processes that may include spot welding technology, laser beam welding technology, ultrasonic welding technology, electric resistance welding technology, fusion technology, and/or the like to combine the metal submount 102 to the lead frame 408. In this regard, the one or more metal contacts 404 that were initially part of the lead frame 408 may be implemented as a thin layer of metal that connects wiring from electrical terminals on a surface the one or more semiconductor devices 400 to large-scale circuitry on electrical devices and circuit boards. In this regard, a thickness of the one or more metal contacts 404, the flag portions 406, the lead frame strip 490, and/or the lead frame 408 may be much less than a thickness of the metal submount 102.

In particular, the disclosed device and method may combine the lead frame strip 490 and/or the lead frame 408 with the metal submount 102 utilizing the fabrication attach processes. In aspects, utilizing the fabrication attach processes to form the connection 410 may not need any preparations on the metal submount 102. In this regard, the metal submount 102 will need no rivet, no cylindrical protrusion, and/or the like as described above in conjunction with the current package in preparation for combining and/or attaching the lead frame strip 490 and/or the lead frame 408 to the metal submount 102.

In aspects, the flag portions 406 or overhang of the lead frame strip 490 and/or the lead frame 408 may be all that is needed to implement the fabrication attach processes for forming the connection 410 as a connection between the lead frame strip 490 and/or the lead frame 408 and the metal submount 102. The flag portions 406 may also be changed for different configurations of the lead frame strip 490 and/or the lead frame 408 without the need to change a tooling to create the cylindrical protrusions as used in the current processes described above. All that may be needed is to change the processes associated with the fabrication attach processes. For example, the fabrication attach processes that may be implemented as spot welding may only require changing pin positions on spot welding tips.

The disclosed fabrication attach processes may be more efficient in creating more space in a die paddle area of the metal submount 102 for the one or more semiconductor devices 400 in comparison with the current rivet package designs as described above. In this regard and as illustrated in FIG. 3, a useable space for die attach 412 may be proportional to a terminal width 414 of the one or more metal contacts 404 and the device and method of the disclosure is advantageous in the use the fabrication attach processes that may increase the useable space for die attach 412 and/or usable space on the metal submount 102 for die attach, such as the one or more semiconductor devices 400, in comparison to packages implementing the current riveting method. In this regard, for the current package the thicker the heat sink, the more space on the heat sink the rivets will need.

In this case, the disclosed device and method can gain approximately 40% more of the useable space for die attach 412 and/or die attach area on the metal submount 102 in some implementations, which translates directly to how much power can be utilized by the package 100. The disclosed device and method may also improve the efficiency of package 100. In particular, the efficiency in regards of the useable space for die attach 412 on the metal submount 102 versus overall size of the package 100.

The areas of the fabrication attach processes, such as spot welding, that form the connection 410 and/or the flag portions 406 can then also be used for a mold clamp to hold down the package 100 during subsequent manufacturing processes, such as molding. In this regard, the areas of the fabrication attach processes that form the connection 410 and/or the flag portions 406 may be located on a very outside of the package 100 and/or the metal submount 102, which is more preferred than the cylindrical pin clamp inside the current package on top of the rivets of the current design. Referring back to FIG. 1, the package 100 may include locations 492 configured to receive the mold clamp to hold down the package 100 during subsequent manufacturing processes. Additionally, the aspects described herein implemented with the package 100 and the fabrication attach processes can also be utilized to combine lead frame materials to heat sinks for other types of semiconductor devices. In this regard, the disclosed device and method was implemented in response to difficulties in not having enough of the useable die attach area on the metal submount 102 as the rivets of the current package could consume up almost 50% of the total package size.

Figure 7:
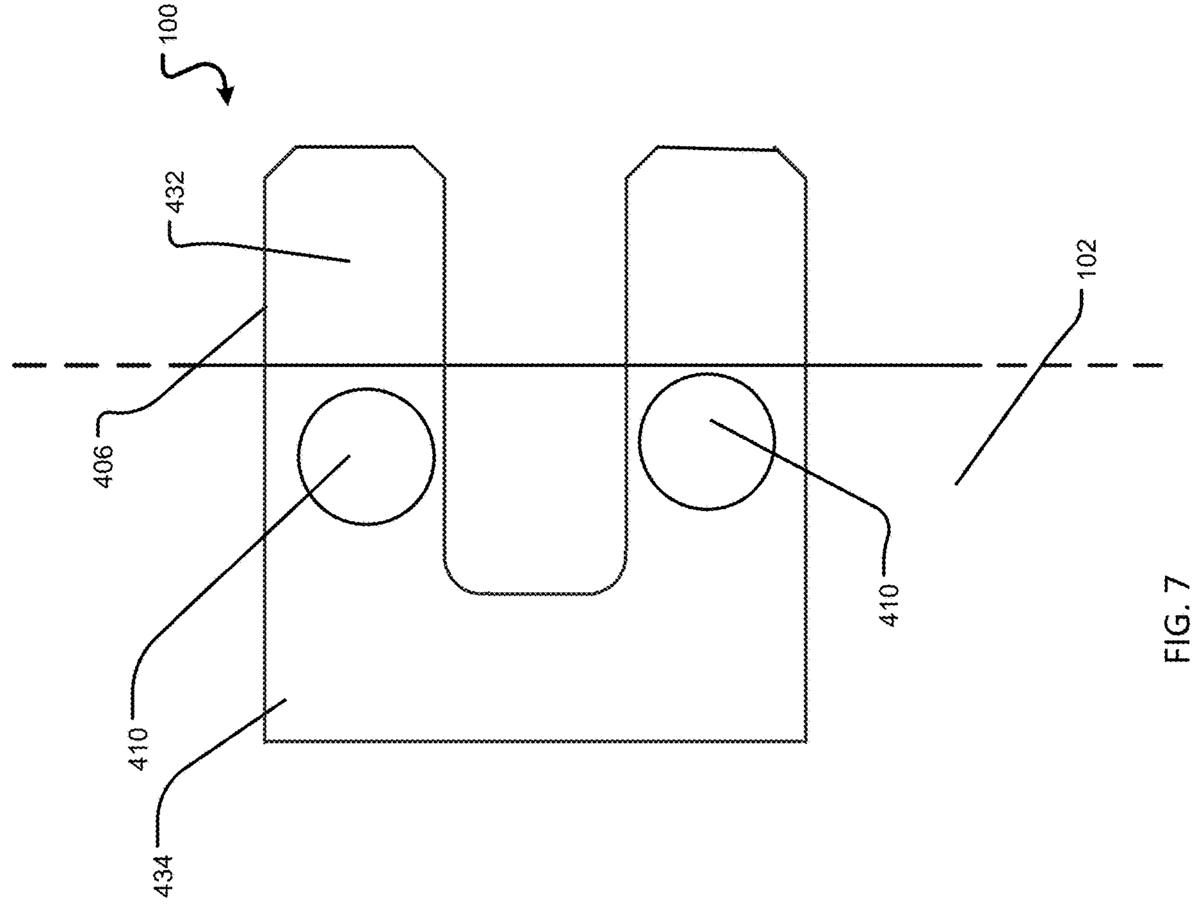
FIG. 7 illustrates a partial top view of the package according to FIG. 1.

FIG. 7 illustrates a partial top view of the package according to FIG. 1.

Figure 8:
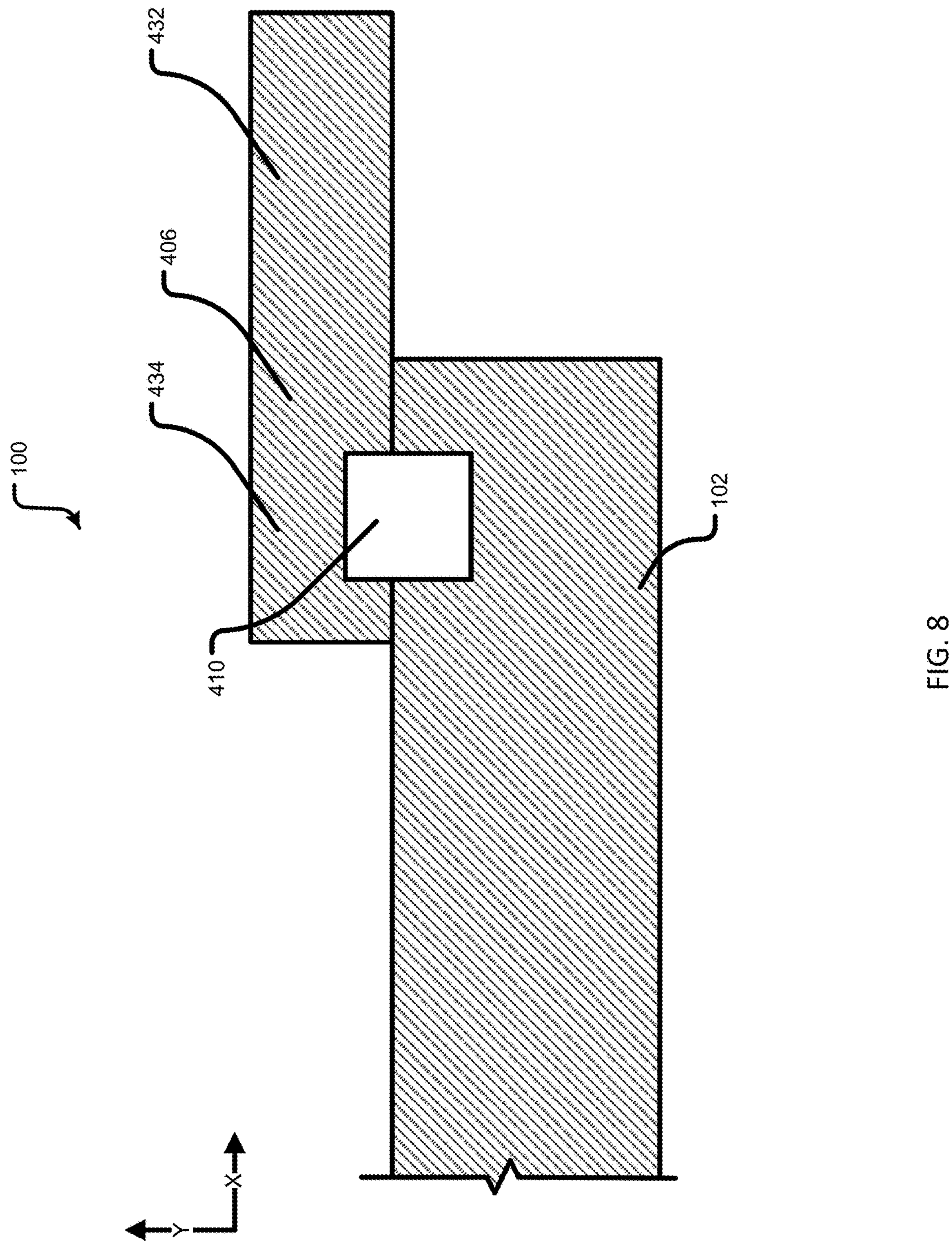
FIG. 8 illustrates a partial side view of the package according to FIG. 7.

FIG. 8 illustrates a partial side view of the package according to FIG. 7.

In particular, FIG. 7 illustrates a partial top view of the package 100 including a portion of the metal submount 102 and the flag portions 406. In this regard, the flag portions 406 as described above may be initially a part of the lead frame strip 490 and/or the lead frame 408 and the flag portions 406 may have an outside portion 432 arranged outside of the metal submount 102. Additionally, the flag portions 406 may have an inside portion 434 arranged on the metal submount 102. The connection 410 may be arranged in the inside portion 434 of the flag portions 406. The flag portions 406 may include any number of the connection 410. In aspects, the flag portions 406 may include 1, 2, 3, 4, 5, 6, 7, 8, 9, or 10 implementations of the connection 410.

The connection 410 may be formed utilizing the fabrication attach processes. In particular aspects, the connection 410 connecting the flag portions 406 to the metal submount 102 may be implemented without rivets, the metal submount 102 may be implemented without mechanical fasteners, the metal submount 102 may be implemented free of rivets, the metal submount 102 may be implemented free of mechanical fasteners, and/or the like. In aspects, utilizing the fabrication attach processes and/or the connection 410 as described herein may result in an upper surface of the metal submount 102 that may be generally flat, an upper surface of the metal submount 102 that may be flat, an upper surface of the metal submount 102 that may be continuous, and/or the like adjacent the one or more metal contacts 404, laterally adjacent the one or more metal contacts 404, and/or the like.

In aspects, the connection 410 may be generated utilizing the fabrication attach processes to create a fusion of material between the metal submount 102 and the flag portions 406 of the lead frame 408. In aspects, the connection 410 may be generated utilizing the fabrication attach processes utilizing a material of the metal submount 102 and the flag portions 406 of the lead frame 408. Additionally, the fabrication attach processes may utilize various automated manufacturing tools and systems such as jigs, robotic systems, and/or the like. In aspects, the connection 410 is configured as a spot welded portion, a laser beam modified portion, a laser beam welded portion, an ultrasonic welded portion, an electric resistance welded portion, a fused metal welded portion, and/or the like.

In aspects, the fabrication attach processes as described herein may be utilized consistently with any thickness of the metal submount 102 and any thickness of the flag portions 406 of the lead frame 408. In this regard, the current rivet technology requires substantial changes in operation for changes in the thickness of the metal submount 102 and/or thicknesses of the flag portions 406 of the lead frame 408. On the other hand, the fabrication attach processes of the disclosure operates with any thickness of the metal submount 102 and any thickness of the flag portions 406 of the lead frame 408. Accordingly, implementations of the package 100 may utilize a thicker implementation of the metal submount 102 to provide a greater conduction of heat from the components of the package 100.

Figure 9:
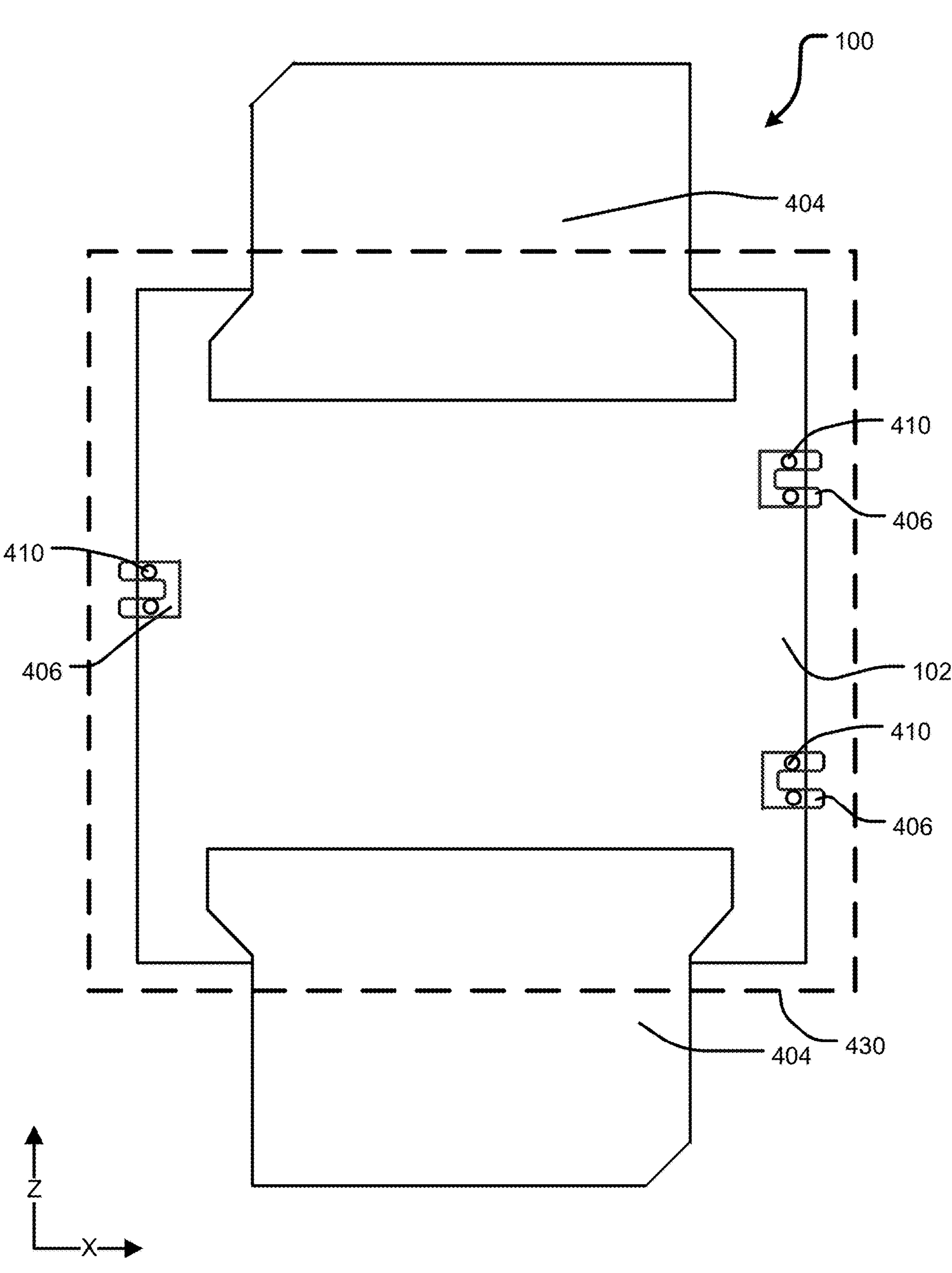
FIG. 9 illustrates another partial top view of the package according to FIG. 1.

FIG. 9 illustrates another partial top view of the package according to FIG. 1.

In particular, FIG. 9 illustrates another implementation of the package 100. The aspects illustrated in FIG. 9 and described in conjunction with FIG. 9 may be implemented with any other aspects of the disclosure. In this regard, FIG. 9 illustrates that the flag portions 406 and/or the connection 410 may be arranged in any location on/or adjacent the metal submount 102 of the package 100. In this regard, FIG. 3 illustrated a centrally located implementation of the connection 410 and/or the flag portions 406. As illustrated in FIG. 9, the connection 410 and/or the flag portions 406 may be arranged at various locations on the metal submount 102 of the package 100. Moreover, implementations of the connection 410 and/or the flag portions 406 may be arranged symmetrically as illustrated in FIG. 3 or asymmetrically as illustrated in FIG. 9. In this regard, the disclosed implementation of the package 100 may utilize any number or arrangement of the flag portions 406 and/or any number or arrangement of the connection 410 in the package 100. Additionally, FIG. 9 illustrates the arrangement of the overmold configuration 430 (shown as transparent with dashed lines for clarity of illustration).

In aspects, the fabrication attach processes may utilize welding technology. In this regard, the welding technology may be a fabrication process that joins materials of the metal submount 102 and the flag portions 406 by using high heat to melt parts of the metal submount 102 and the flag portions 406 together to form the connection 410. Accordingly, the connection 410 may form a joint between the metal submount 102 and the flag portions 406. In particular, the connection 410 may form a joint utilizing the materials of the metal submount 102 and the flag portions 406. Additionally, pressure may be applied to the metal submount 102 and the flag portions 406 during the fabrication attach processes. Moreover, during the fabrication attach processes a shield may be utilized to protect the metals of the metal submount 102 and the flag portions 406 from being contaminated or oxidized. Alternatively, the connection 410 may be formed utilizing brazing and soldering.

Figure 10:
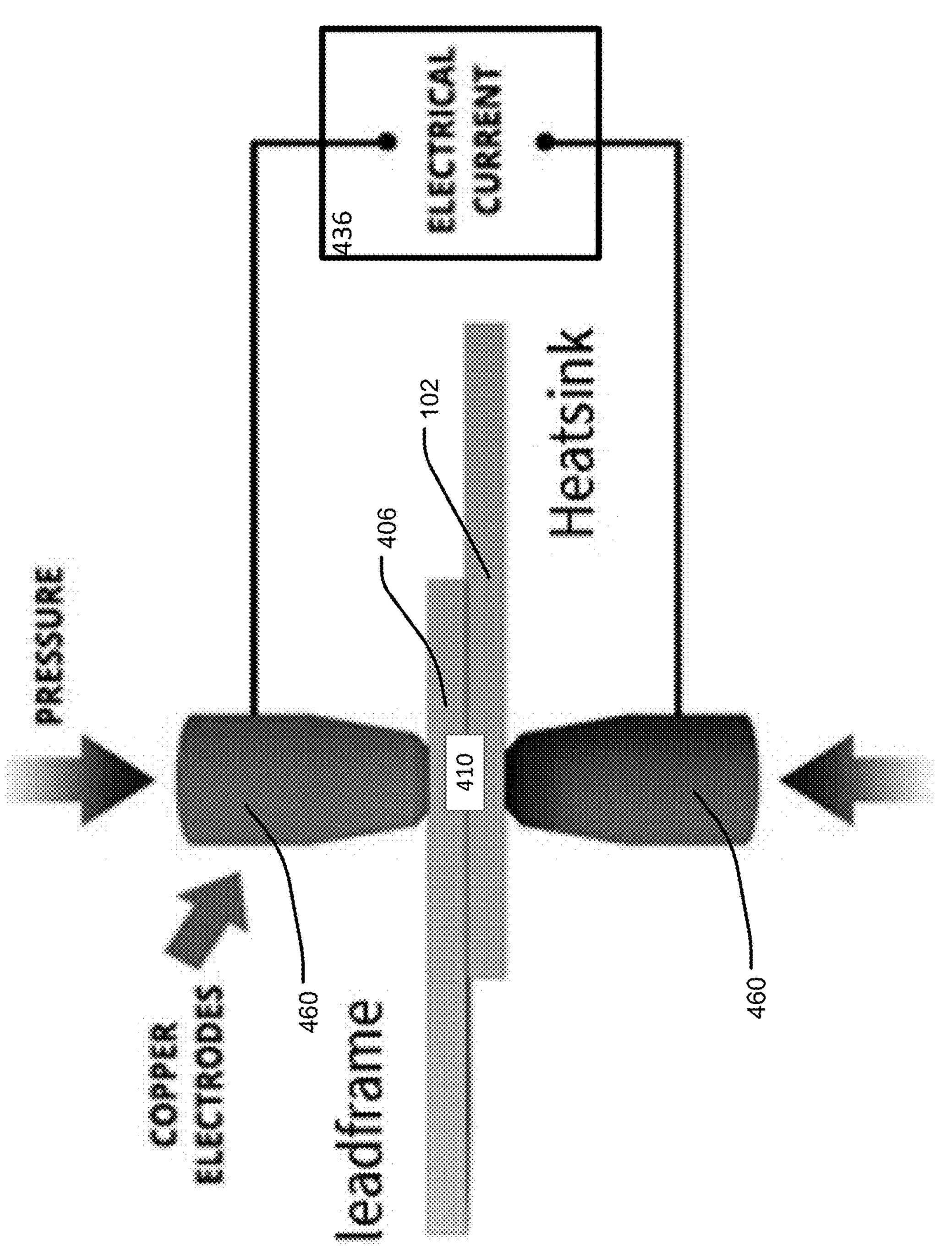
FIG. 10 illustrates an exemplary implementation of the fabrication attach processes according to aspects of the disclosure.

FIG. 10 illustrates an exemplary implementation of the fabrication attach processes according to aspects of the disclosure.

In particular, FIG. 10 illustrates an exemplary implementation of the fabrication attach processes that may utilize spot welding or resistance spot welding. In this aspect, the fabrication attach processes may utilize a type of electric resistance welding by contacting metal surface points of the metal submount 102 and the flag portions 406 to form the connection 410. In particular, the metal submount 102 and the flag portions 406 may be joined by the heat obtained from resistance to electric current 436 to form the connection 410. In particular, the connection 410 may form a joint utilizing the materials of the metal submount 102 and the flag portions 406. In aspects, the fabrication attach processes may utilize electrodes 460, and that may be two shaped copper alloy electrodes, to concentrate welding current into a small "spot" to form the connection 410. In aspects, the fabrication attach processes may simultaneously clamp the metal submount 102 and the flag portions 406 together under pressure exerted by electrodes 460. In aspects, the fabrication attach processes may force a current through the spot and may melt the metal and form the weld between the metal submount 102 and the flag portions 406 to form the connection 410.

Figure 11:
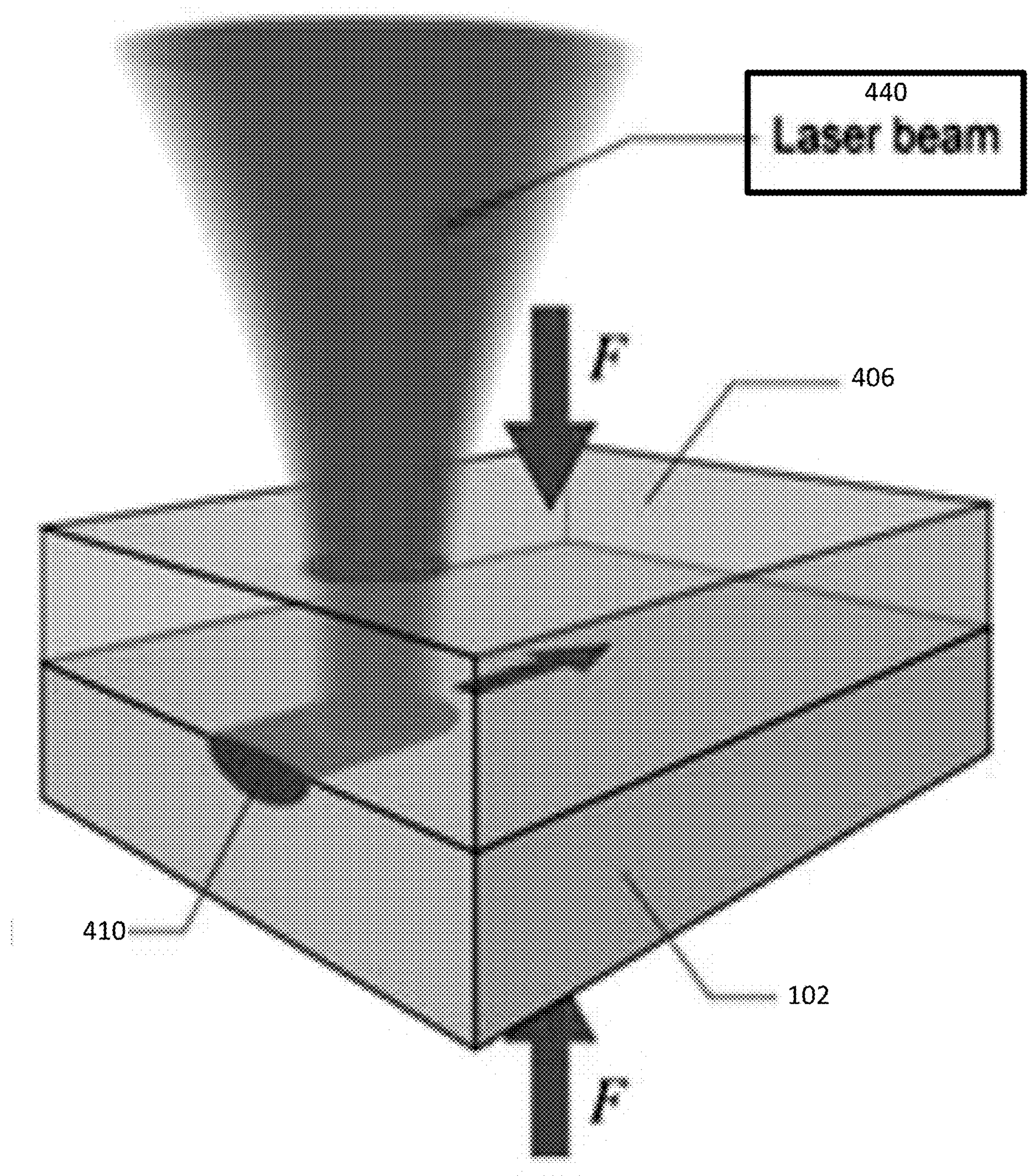
FIG. 11 illustrates an exemplary implementation of the fabrication attach processes according to aspects of the disclosure.

FIG. 11 illustrates an exemplary implementation of the fabrication attach processes according to aspects of the disclosure.

In particular, FIG. 11 illustrates an exemplary implementation of the fabrication attach processes that may utilize Laser beam welding (LBW) to form the connection 410 and join the metal submount 102 and the flag portions 406 through the use of a laser 440. The beam of the laser 440 may provide a concentrated heat source, allowing for narrow, deep welds and high welding rates. In particular, the connection 410 may form a joint utilizing the materials of the metal submount 102 and the flag portions 406. In aspects, the flag portions 406 may be formed with a small hole to assist implementation of the Laser beam welding (LBW) to form the connection 410 and join the metal submount 102 and the flag portions 406.

A depth of penetration of the laser 440 may be proportional to the amount of power supplied and a location of the focal point. In aspects, the location of the focal point may be at a lower surface of the flag portions 406 and an upper surface of the metal submount 102. The laser 440 may be implemented as a continuous laser beam, a pulsed laser beam, and/or the like depending upon the application, a thickness of the metal submount 102, a thickness of the flag portions 406, and/or the like.

In aspects, the fabrication attach processes may utilize Electron-beam welding (EBW). In this aspect, the fabrication attach processes may be a fusion welding process in which a beam of high-velocity electrons is applied to the metal submount 102 and the flag portions 406 to form the connection 410. The metal submount 102 and the flag portions 406 may melt and flow together as the kinetic energy of the electrons is transformed into heat upon impact with the flag portions 406 and the package 100 to the form of the connection 410. In particular, the connection 410 may form a joint utilizing the materials of the metal submount 102 and the flag portions 406. Aspects of the fabrication attach processes may be performed under vacuum conditions to prevent dissipation of the electron beam.

In aspects, the fabrication attach processes may utilize ultrasonic welding to form the connection 410. In particular, the fabrication attach processes may utilize high-frequency ultrasonic acoustic vibrations that may be locally applied to the metal submount 102 and the flag portions 406 being held together under pressure to create a solid-state weld and form the connection 410. In particular, the connection 410 may form a joint utilizing the materials of the metal submount 102 and the flag portions 406.

In aspects, the fabrication attach processes may utilize eutectic bonding. In this regard, the fabrication attach processes may utilize eutectic bonding between the metal submount 102 and the flag portions 406 to form the connection 410 as a eutectic system. The eutectic system may be used between surfaces of the metal submount 102 and the flag portions 406 to be connected through the connection 410. The eutectic bonding may utilize metals that may be alloys and/or intermetallics that transition from solid to liquid state, or from liquid to solid state, at a specific composition and temperature. The eutectic alloys may be deposited by sputtering, evaporation, electroplating, and/or the like on the metal submount 102 and/or the flag portions 406.

In aspects, the connection 410 may be formed by a combination of the fabrication attach processes. For example, the connection 410 may be formed in part by soldering or use of a solder material. The solder material may be a soft solder material, a eutectic material, and/or the like. Additionally, the connection 410 may be formed in part by one or more of the welding processes described herein. For example, the connection 410 may be formed in part by Laser beam welding (LBW), spot welding, and/or the like. In this regard, the combination of solder material (soft or eutectic) with welding (laser and spot) may help lower temperature requirements, pressure requirements, and/or the like for formation of the connection 410. In aspects, a spot plated material, such as Tin (Sn) may be utilized to create a low melting Copper-Tin (CuSn) alloy that could be formed using a combination of the fabrication attach processes.

In aspects, the fabrication attach processes may utilize an adhesive to form the connection 410. In particular, the fabrication attach processes may utilize an adhesive bonding process that may include applying an intermediate layer to connect surfaces of the metal submount 102 and the flag portions 406 to form the connection 410. The adhesive may be organic or inorganic; and the adhesive may be deposited on one or more surfaces of the metal submount 102 and the flag portions 406. The adhesive may be utilized in an adhesive bonding process that may include applying adhesive material with a particular coating thickness, at a particular bonding temperature, for a particular processing time while in an environment that may include applying a particular tool pressure. In one aspect, the adhesive may be a conductive adhesive, an epoxy-based adhesive, a conductive epoxy-based adhesive, and/or the like.

The fabrication attach processes may form the connection 410 much faster than the rivets utilized by the current package. Additionally, the connection 410 may form a clamping area for subsequent processing of the package 100 including forming the overmold configuration 430, attaching the one or more semiconductor devices 400, arranging the one or more interconnects 104, and/or the like.

The package 100 utilizing the fabrication attach processes to form the connection 410 may increase a size of the useable space for die attach 412 and may allow implementation of larger configurations of the one or more semiconductor devices 400. Accordingly, a power density of the package 100 is greatly increased in comparison to the current package. Moreover, the power package area of the package 100 is greatly increased in comparison to the current package. In this regard, a power density of the package 100 implemented utilizing the fabrication attach processes and/or the connection 410 as disclosed herein may be increased 10%, 20%, 30%, 40%, 50%, or 60%.

Additionally, the one or more metal contacts 404 may no longer have to be sized to avoid a location of a rivet as required in the current package. Accordingly, the one or more metal contacts 404 may have a greater width in comparison to the terminals of the current package. Moreover, having a greater width of the one or more metal contacts 404 may allow larger implementations of the one or more semiconductor devices 400. In this regard, a width of the one or more metal contacts 404 may dictate an implementation size of the one or more semiconductor devices 400 as it is beneficial for the one or more interconnects 104 to extend directly from the one or more metal contacts 404 to the one or more semiconductor devices 400 as illustrated in FIG. 6A or FIG. 6B. In this regard, fanning out the one or more interconnects 104 from the one or more metal contacts 404 to the one or more semiconductor devices 400 may have impacts on performance of the package 100.

The size of the flag portions 406, a location of the flag portions 406, a number of the flag portions 406, and/or the like may be changed for different applications of the package 100, different implementations of the package 100, different configurations of the lead frame 408, different sizes of the lead frame 408, and/or the like easily utilizing the fabrication attach processes. In particular, utilizing the fabrication attach processes as described herein may not require changing a tooling to create the cylindrical protrusions as used in the current processes described above regarding the current package. For example, various implementations of the flag portions 406 may only require a change in the positioning of the electrodes 460 illustrated in FIG. 10.

In aspects, the useable space for die attach 412 of the package 100 may be increased by 10%, 20%, 30%, 40%, 50%, or 60% in comparison to the useable die attach area 14 of the current package 1. In aspects, the useable space for die attach 412 of the package 100 may be 70%, 80%, or 90% of the surface area of the metal submount 102.

In aspects, the terminal width 414, as illustrated in FIG. 3, may be increased 10%, 20%, 30%, 40%, or 50% in comparison to the terminal width 10 of the current package 1. In aspects, the terminal width 414 of the package 100 may be 70%, 80%, or 90% of a width of the metal submount 102.

Referring back to FIG. 1, FIG. 2, and FIG. 3, the one or more semiconductor devices 400 may be implemented as one or more of a wide band-gap semiconductor device, an ultra-wideband device, a GaN based device, a Metal Semiconductor Field-Effect Transistor (MESFET), a Metal Oxide Field Effect Transistor (MOSFET), a Junction Field Effect Transistor (JFET), a Bipolar Junction Transistor (BJT), an Insulated Gate Bipolar Transistor (IGBT), a high-electron-mobility transistor (HEMT), a Wide Band Gap (WBG) semiconductor, a power module, a gate driver, a component such as a General-Purpose Broadband component, a Telecom component, a L-Band component, a S-Band component, a X-Band component, a C-Band component, a Ku-Band component, a Satellite Communications component, a Doherty configuration, and/or the like.

In this regard, the one or more semiconductor devices 400 may be arranged on the metal submount 102 via a die attach material 422 with the one or more interconnects 104 shown in an exemplary configuration that may connect between the package 100, the one or more metal contacts 404, and/or the one or more semiconductor devices 400. The metal submount 102 may dissipate the heat generated by the one or more semiconductor devices 400 while simultaneously isolating and protecting the one or more semiconductor devices 400 from the outside environment. In aspects, the die attach material 422 may utilize an adhesive, soldering, sintering, eutectic bonding, thermal compression bonding, ultrasonic bonding/welding, a clip component, and/or the like as described herein.

The package 100 may include the overmold configuration 430, the one or more metal contacts 404 such as one or more input/output pins, and the metal submount 102. The overmold configuration 430 may substantially surround the one or more semiconductor devices 400 and/or the other components, which are mounted on the metal submount 102 using a die attach material. The overmold configuration 430 may be formed of a plastic or a plastic polymer compound, which may be injection molded around the metal submount 102, the one or more semiconductor devices 400 and/or the other components, and/or the like, thereby providing protection from the outside environment. Additionally, the mold compound of the overmold configuration 430 may keep the lead frame 408 and the one or more metal contacts 404 in the proper location with respect to the metal submount 102 prior to trimming the lead frame strip 490 and/or the lead frame 408. After the overmold configuration 430 is formed, the lead frame strip 490 and/or the lead frame 408 may be trimmed so that the package 100 includes only the one or more metal contacts 404 and the flag portions 406. In other words, the mold compound of the overmold configuration 430 keeps the lead frame strip 490 and/or the lead frame 408 connected to the metal submount 102 so that the trimming operation can disconnect the one or more metal contacts 404 from the lead frame 408 which also isolates the one or more metal contacts 404 from each other. The one or more semiconductor devices 400 and/or the other components may be coupled to the one or more metal contacts 404 via the one or more interconnects 104.

In one aspect, the over-mold configuration may substantially surround the one or more semiconductor devices 400, other components, and/or the like. The over-mold configuration may be formed of a plastic, a mold compound, a plastic compound, a polymer, a polymer compound, a plastic polymer compound, and/or the like. The over-mold configuration may be injection molded, transfer molded, and/or compression molded around the one or more semiconductor devices 400, other components, and/or the like, thereby providing protection for the other components, the one or more semiconductor devices 400, and other components of the package 100 from the outside environment.

The one or more interconnects 104 may utilize ball bonding, wedge bonding, compliant bonding, ribbon bonding, metal clip attach, and/or the like. In one aspect, the one or more interconnects 104 may utilize the same type of connection. In one aspect, the one or more interconnects 104 may utilize different types of connections.

The one or more interconnects 104 may be include various metal materials including one or more of aluminum, copper, silver, gold, and/or the like. In one aspect, the one or more interconnects 104 may utilize the same type of metal. In one aspect, the one or more interconnects 104 may utilize different types of metal. The one or more interconnects 104 may connect to a plurality of interconnect pads of components of the package 100 by an adhesive, soldering, sintering, eutectic bonding, thermal compression bonding, ultrasonic bonding/welding, a clip component, and/or the like as described herein.

The metal submount 102 may be implemented as a support, a surface, a package support, a package surface, a package support surface, a flange, a metal flange, a heat sink, a common source support, a common source surface, a common source package support, a common source package surface, a common source package support surface, a common source flange, a common source heat sink, a lead frame, a metal lead frame and/or the like. The metal submount 102 may include an insulating material, a dielectric material, and/or the like. In aspects, the metal submount 102 may be silverplated.

Figure 12:
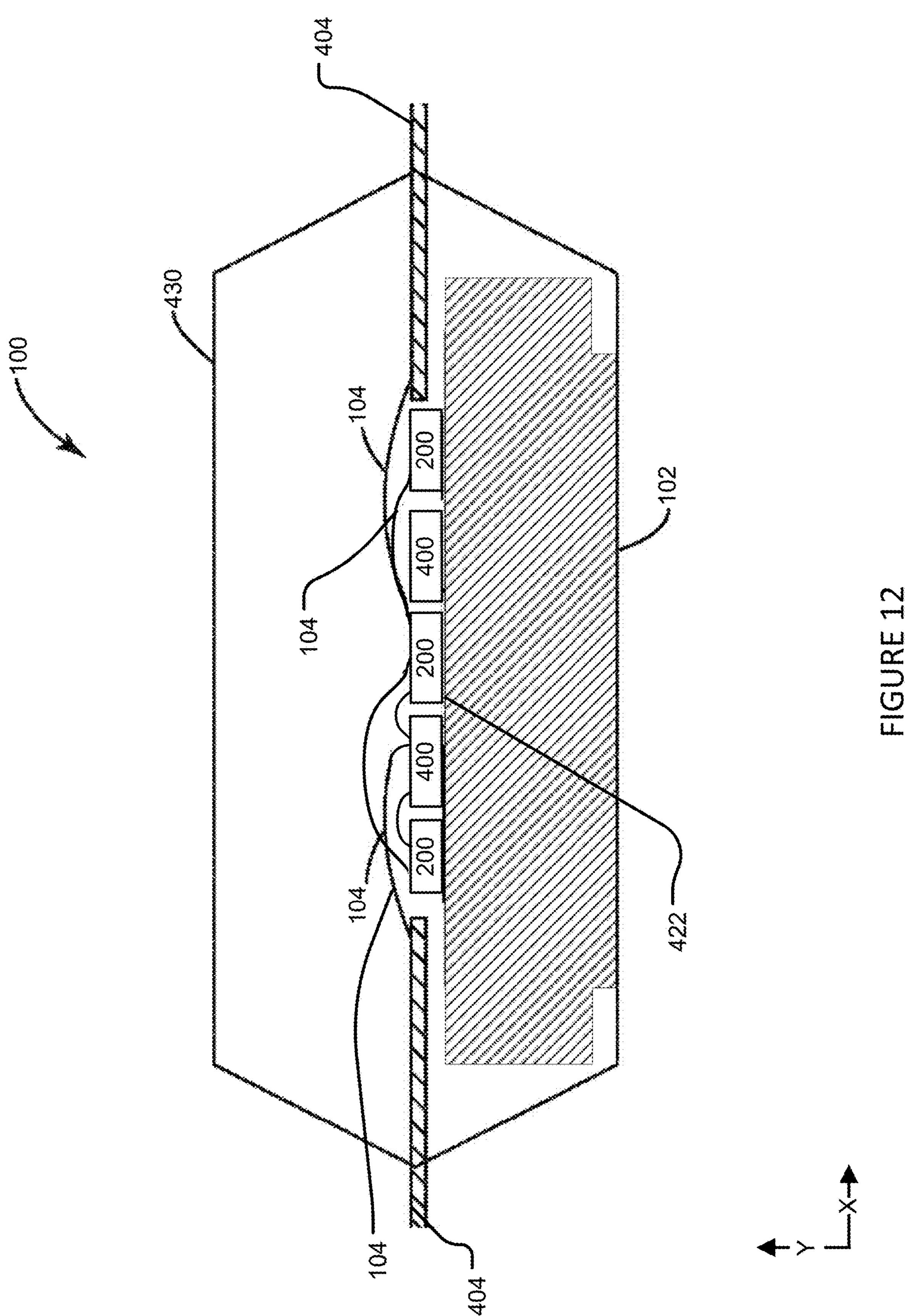
FIG. 12 illustrates a cross-sectional side view of the package according to FIG. 1.

FIG. 12 illustrates a cross-sectional view of the package according to FIG. 1.

In particular, FIG. 12 illustrates another implementation of the package 100. The aspects illustrated in FIG. 12 and described in conjunction with FIG. 12 may be implemented with any other aspects of the disclosure. In this regard, the package 100 may further include other components 200.

In this regard, the other components 200 may be arranged on the metal submount 102 via a die attach material 422 with the one or more interconnects 104 shown in an exemplary configuration that may connect between the package 100, the other components 200, and/or the one or more semiconductor devices 400. The metal submount 102 may dissipate the heat generated by the one or more semiconductor devices 400 and the other components 200 while simultaneously isolating and protecting the one or more semiconductor devices 400 and the other components 200 from the outside environment. In aspects, the die attach material 422 may utilize an adhesive, soldering, sintering, eutectic bonding, thermal compression bonding, ultrasonic bonding/welding, a clip component, and/or the like as described herein.

The other components 200 may be implemented as at least part of a RF device. The other components 200 may implement matching networks, harmonic termination circuitry, integrated passive devices (IPD), capacitors, resistors, inductors, and/or the like.

In aspects, the other components 200 may be used for matching networks, pre-matching, bias-decoupling, thermal-grounding, and/or the like in RF power products and/or the like. The other components 200 may be attached inside a package, such as an open cavity package or over-mold package, together with transistor die, such as Gallium nitride (GaN) transistor die, and other capacitors, IPDs, and/or the like and connected with wire bonds to each other and to package leads. Metallization on the top and bottom of the substrate, together with vias routed through the substrate may enable the creation of bond-pads, inductive strips, inductive coils, capacitive stubs, and/or the like.

Additionally, inside the package 100, the other components 200 may be arranged on the metal submount 102 as described herein with the one or more interconnects 104 shown in an exemplary configuration. Moreover, inside the package 100, the other components 200 and may be arranged on the metal submount 102. The package 100 may include the overmold configuration 430, the one or more metal contacts 404 such as one or more input/output pins, and the metal submount 102. The overmold configuration 430 may substantially surround the one or more semiconductor devices 400 and/or the other components 200, which are mounted on the metal submount 102 using a die attach material. The overmold configuration 430 may be formed of a plastic or a plastic polymer compound, which may be injection molded around the metal submount 102, the one or more semiconductor devices 400 and/or the other components 200, and/or the like, thereby providing protection from the outside environment. The one or more semiconductor devices 400 and/or the other components 200 may be coupled to the one or more metal contacts 404 via the one or more interconnects 104.

In one aspect, the over-mold configuration may substantially surround the one or more semiconductor devices 400, the other components 200, and/or the like. The over-mold configuration may be formed of a plastic, a mold compound, a plastic compound, a polymer, a polymer compound, a plastic polymer compound, and/or the like. The over-mold configuration may be injection molded, transfer molded, and/or compression molded around the one or more semiconductor devices 400, the other components 200, and/or the like, thereby providing protection for the other components 200, the one or more semiconductor devices 400, and other components of the package 100 from the outside environment.

The package 100 may be implemented as an RF package and the other components 200 may be implemented as a radio frequency device that may include, connect, support, or the like a transmitter, transmitter functions, a receiver, receiver functions, a transceiver, transceiver functions, matching network functions, harmonic termination circuitry, integrated passive devices (IPD), and the like. The other components 200 implemented as a radio frequency device may be configured to, may support, or the like transmitting a radio wave and modulating that wave to carry data with allowable transmitter power output, harmonics, and/or band edge requirements. The other components 200 may be implemented as a radio frequency device and may be configured to, may support, or the like receiving a radio wave and demodulating the radio wave. The other components 200 implemented as a radio frequency device and may be configured to, may support, or the like transmitting a radio wave and modulating that wave to carry data with allowable transmitter power output, harmonics, and/or band edge requirements; and may be configured to, may support, or the like receiving a radio wave and demodulating the radio wave.

In aspects, the package 100 may include any number of the one or more semiconductor devices 400 and any number of the other components 200. In one aspect, the other components 200 may be configured to attach to the metal submount 102. In one aspect, the other components 200 may be configured to directly attach to the metal submount 102.

In one aspect, the other components 200 may configured with an interstage matching implementation. In one aspect, the other components 200 may be configured with an output prematching implementation. In one aspect, the other components 200 may be configured with an input prematching implementation. However, the other components 200 may be implemented for other functionality.

The package 100 may further include one or more feed network components that may include one or more input splitting nodes that may be connected to one or more input bond pads by one or more transmission lines. The package 100 may further include one or more output IPD components that may be connected to one or more output bond pads by one or more transmission lines. In aspects, the output IPD components may be implemented with a ceramic substrate.

The other components 200 may be configured as an output prematching implementation. In aspects, the other components 200 may be configured as an interstage matching implementation and may be placed in between a driver implementation of the one or more semiconductor devices 400 and a final stage die implementation of the one or more semiconductor devices 400. In aspects, the other components 200 may be configured as an input prematching implementation that may transform an input impedance of the final stage die implementation of the one or more semiconductor devices 400 to a target impedance for the driver die implementation of the one or more semiconductor devices 400.

Additionally, the other components 200 may include a circuit structure. In particular, the circuit structure may be arranged and configured to provide an inductance, capacitance, resistance, and/or the like. In one aspect, the circuit structure may be a metallic surface arranged on the upper surface and together with the metallization layer, may create a capacitor. Additionally, the circuit structure may be configured as inductive strips, inductive coils, capacitive stubs, and/or the like.

Figure 13:
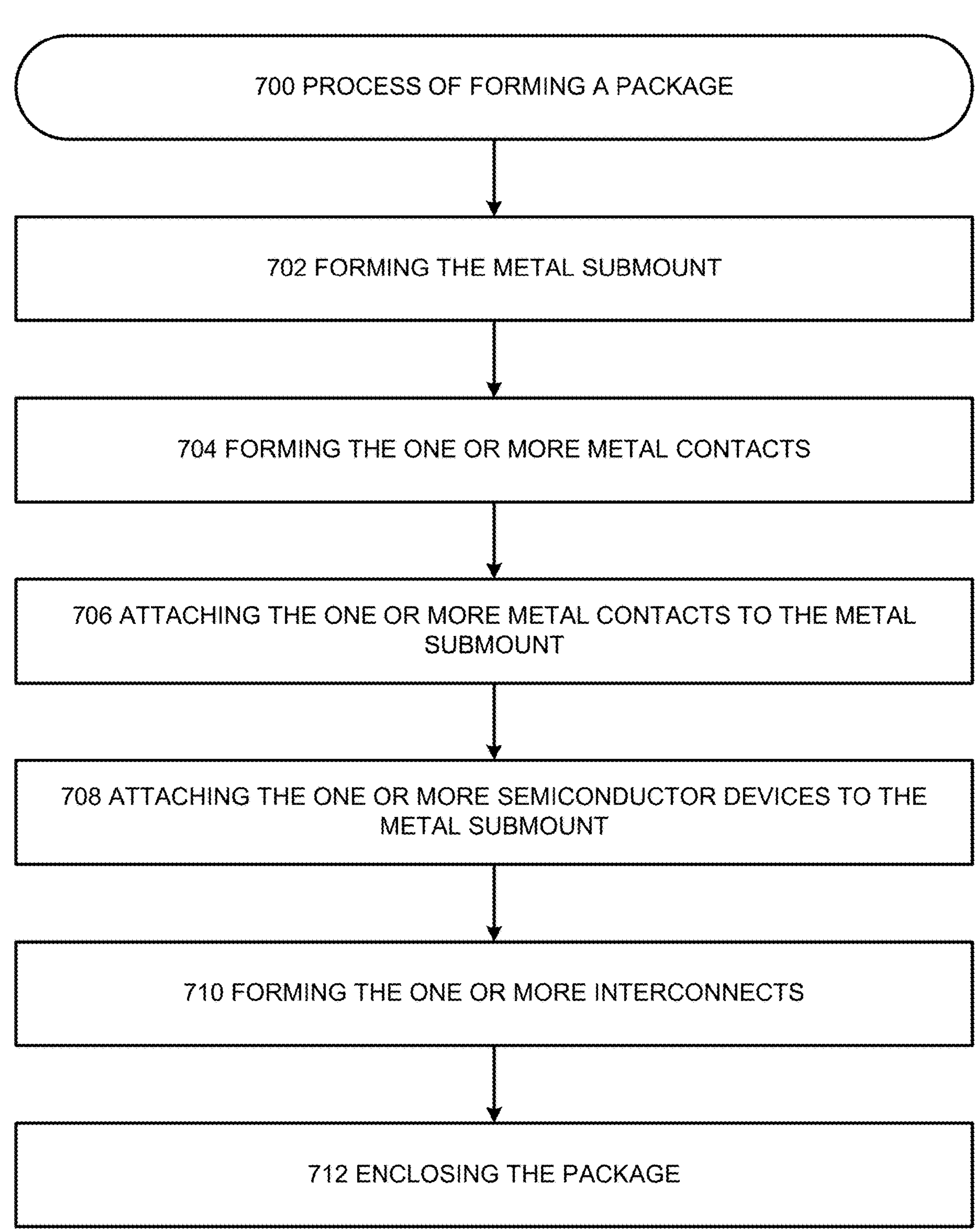
FIG. 13 shows a process of making a package according to the disclosure.

FIG. 13 shows a process of making a package according to the disclosure.

In particular, FIG. 13 illustrates a process of forming a package 700 that relates to the package 100 as described herein. It should be noted that the aspects of the process of forming a package 700 may be performed in a different order consistent with the aspects described herein. Additionally, it should be noted that portions of the process of forming a package 700 may be performed in a different order consistent with the aspects described herein. Moreover, the process of forming a package 700 may be modified to have more or fewer processes consistent with the various aspects disclosed herein. Additionally, the process of forming a package 700 may include any other aspects of the disclosure described herein.

The process of forming a package 700 may include a process of forming the metal submount 702. In aspects, the process of forming the metal submount 702 may include a process of forming the metal submount 102. More specifically, the metal submount 102 may be constructed, configured, and/or arranged as described herein. In one aspect, the process of forming the metal submount 702 may include forming the metal submount 102 as a support, a surface, a package support, a package surface, a package support surface, a flange, a heat sink, a common source heat sink, and/or the like.

The process of forming a package 700 may include a process of forming the one or more metal contacts 704. In aspects, the process of forming the one or more metal contacts 704 may include a process of forming the one or more metal contacts 404. More specifically, the one or more metal contacts 404 may be constructed, configured, and/or arranged as described herein. In aspects, the process of forming the one or more metal contacts 704 may include forming the lead frame 408 with the one or more metal contacts 404, the flag portions 406, and the lead frame portions 420. The lead frame portions 420 may initially connect the flag portions 406 to the one or more metal contacts 404. In particular, during manufacturing of the package 100, the lead frame 408 may be constructed with the one or more metal contacts 404, the flag portions 406, and the lead frame portions 420. In this regard, the lead frame 408 may be constructed from a strip of metal material that is processed to form the one or more metal contacts 404, the flag portions 406, and the lead frame portions 420. More specifically, the lead frame 408 may be stamped, punched, etched, and/or the like to form the one or more metal contacts 404, the flag portions 406, and the lead frame portions 420 from a metal strip.

The process of forming a package 700 may include a process of attaching the one or more metal contacts to the metal submount 706. In aspects, the process of attaching the one or more metal contacts to the metal submount 706 may include a process of attaching the one or more metal contacts 404 to the metal submount 102. More specifically, the one or more metal contacts 404 may be attached, configured, and/or arranged as described herein.

In aspects, the process of attaching the one or more metal contacts to the metal submount 706 may utilize spot welding or resistance spot welding. In this aspect, the fabrication attach processes may utilize a type of electric resistance welding by contacting metal surface points of the metal submount 102 and the flag portions 406 to form the connection 410. In particular, the metal submount 102 and the flag portions 406 may be joined by the heat obtained from resistance to electric current 436 to form the connection 410. In particular, the connection 410 may form a joint utilizing the materials of the metal submount 102 and the flag portions 406.

In aspects, the process of attaching the one or more metal contacts to the metal submount 706 may utilize Laser beam welding (LBW) to form the connection 410 and join the metal submount 102 and the flag portions 406 through the use of a laser 440. The beam of the laser 440 may provide a concentrated heat source, allowing for narrow, deep welds and high welding rates. In particular, the connection 410 may form a joint utilizing the materials of the metal submount 102 and the flag portions 406.

In aspects, the process of attaching the one or more metal contacts to the metal submount 706 may utilize Electron-beam welding (EBW). In this aspect, the fabrication attach processes may be a fusion welding process in which a beam of high-velocity electrons is applied to the metal submount 102 and the flag portions 406 to form the connection 410. The metal submount 102 and the flag portions 406 may melt and flow together as the kinetic energy of the electrons is transformed into heat upon impact with the flag portions 406 and the package 100 to the form of the connection 410.

In aspects, the process of attaching the one or more metal contacts to the metal submount 706 may utilize ultrasonic welding to form the connection 410. In particular, the fabrication attach processes may utilize high-frequency ultrasonic acoustic vibrations that may be locally applied to the metal submount 102 and the flag portions 406 being held together under pressure to create a solid-state weld and form the connection 410.

In aspects, the process of attaching the one or more metal contacts to the metal submount 706 may utilize eutectic bonding. In this regard, the fabrication attach processes may utilize eutectic bonding between the metal submount 102 and the flag portions 406 to form the connection 410 as a eutectic system. In aspects, the process of attaching the one or more metal contacts to the metal submount 706 may utilize an adhesive to form the connection 410.

The process of forming a package 700 may include a process of attaching the one or more semiconductor devices to the metal submount 708. In aspects, the process of attaching the one or more semiconductor devices to the metal submount 708 may include a process of attaching the one or more semiconductor devices 400 to the metal submount 102. More specifically, the one or more semiconductor devices 400 may be attached, configured, and/or arranged as described herein. In aspects, the process of attaching the one or more semiconductor devices to the metal submount 708 may include a process of attaching the one or more semiconductor devices 400 to the metal submount 102 while a clamp is placed on the flag portions 406 and/or the connection 410. In this regard, the clamp may hold the package 100 during at least this manufacturing process.

The process of forming a package 700 may include a process of forming the one or more interconnects 710. In aspects, the process of forming the one or more interconnects 710 may include a process of forming the one or more interconnects 104. More specifically, the one or more interconnects 104 may be attached, configured, and/or arranged as described herein.

In one aspect, the process of forming the one or more interconnects 710 may include forming the one or more interconnects 104 by forming one or more wires, leads, vias, edge platings, circuit traces, tracks, and/or the like. In one aspect, the process of forming the one or more interconnects 710 may include connecting the one or more interconnects 104 by an adhesive, soldering, sintering, eutectic bonding, ultrasonic welding, a clip component, and/or the like as described herein. In one aspect, the process of forming the one or more interconnects 710 may include connecting the one or more interconnects 104 by an adhesive, soldering, sintering, eutectic bonding, ultrasonic welding, a clip component, and/or the like as described herein while a clamp is placed on the flag portions 406 and/or the connection 410. In this regard, the clamp may hold the package 100 during at least this manufacturing process.

The process of forming a package 700 may include a process of enclosing the package 712. In aspects, the process of enclosing the package 712 may include a process of enclosing the package 100 with the overmold configuration 430. More specifically, the package 100 and the overmold configuration 430 may be configured and/or arranged as described herein.

In aspects, the process of enclosing the package 712 may include configuring the overmold configuration 430 to substantially surround the one or more semiconductor devices 400 and/or the other components. In aspects, the process of enclosing the package 712 may include configuring the overmold configuration 430 to substantially surround the one or more semiconductor devices 400 and/or the other components while a clamp is placed on the flag portions 406 and/or the connection 410. In this regard, the clamp may hold the package 100 during at least this manufacturing process.

In aspects, the process of enclosing the package 712 may include forming the overmold configuration 430 of a plastic or a plastic polymer compound, which may be injection molded around the metal submount 102, the one or more semiconductor devices 400 and/or the other components, and/or the like, thereby providing protection from the outside environment. In aspects, the process of enclosing the package 712 may include forming the overmold configuration 430 of a plastic or a plastic polymer compound, which may be injection molded around the metal submount 102, the one or more semiconductor devices 400 and/or the other components, while a clamp is placed on the flag portions 406, the locations 492, and/or the connection 410. In this regard, the clamp may hold the package 100 during at least this manufacturing process.

In aspects, the process of enclosing the package 712 may include trimming the lead frame strip 490 and/or the lead frame 408. In particular, the lead frame strip 490 and/or the lead frame 408 may be trimmed to remove the portions of the lead frame strip 490 and/or the lead frame 408 such that the flag portions 406 and the one or more metal contacts 404 remain. In other words, the lead frame 408 may be trimmed to remove the lead frame portions 420 and/or the like. In aspects, the trimming electrically isolates the one or more metal contacts 404 from the metal submount 102, a source of the one or more semiconductor devices 400, and/or the like.

The package 100 may be implemented in any number of different applications. In this regard, the package 100 may be implemented in applications implementing high video bandwidth power amplifier transistors, a single path radio frequency power transistor, a single stage radio frequency power transistor, a multipath radio frequency power transistor, a Doherty configuration, a multistage radio frequency power transistor, a GaN based radio frequency power amplifier module, a laterally-diffused metal-oxide semiconductor (LDMOS) device, a LDMOS radio frequency power amplifier module, a radio frequency power device, an ultra-wideband device, a GaN based device, a Metal Semiconductor Field-Effect Transistor (MESFET), a Metal Oxide Field Effect Transistor (MOSFET), a Junction Field Effect Transistor (JFET), a Bipolar Junction Transistor (BJT), an Insulated Gate Bipolar Transistor (IGBT), a high-electron-mobility transistor (HEMT), a Wide Band Gap (WBG) semiconductor, a power module, a gate driver, a component such as a General-Purpose Broadband component, a Telecom component, a L-Band component, a S-Band component, a X-Band component, a C-Band component, a Ku-Band component, a Satellite Communications component, and/or the like. The package 100 may be implemented as a power package. The package 100 may be implemented as a power package and may implement applications and components as described herein.

The package 100 may be implemented as a radio frequency package. The package 100 may be implemented as a radio frequency package and may implement applications and components as described herein. The package 100 implemented as a radio frequency package may include, connect, support, or the like a transmitter, transmitter functions, a receiver, receiver functions, a transceiver, transceiver functions, and the like. The package 100 implemented as a radio frequency package may be configured to, may support, or the like transmitting a radio wave and modulating that wave to carry data with allowable transmitter power output, harmonics, and/or band edge requirements. The package 100 implemented as a radio frequency package may be configured to, may support, or the like receiving a radio wave and demodulating the radio wave. The package 100 implemented as a radio frequency package may be configured to, may support, or the like transmitting a radio wave and modulating that wave to carry data with allowable transmitter power output, harmonics, and/or band edge requirements; and may be configured to, may support, or the like receiving a radio wave and demodulating the radio wave.

The other components 200 may be an active device, a passive device, an IPD, a transistor device, or the like. The other components 200 may include any electrical component for any application. In this regard, the other components 200 may be high video bandwidth power amplifier transistors, a single path radio frequency power transistor, a single stage radio frequency power transistor, a multipath radio frequency power transistor, a multistage radio frequency power transistor, a GaN based radio frequency power amplifier module, a laterally-diffused metal-oxide semiconductor (LDMOS) device, a LDMOS radio frequency power amplifier module, a radio frequency power device, an ultra-wideband device, a GaN based device, a Metal Semiconductor Field-Effect Transistor (MESFET), a Metal Oxide Field Effect Transistor (MOSFET), a Junction Field Effect Transistor (JFET), a Bipolar Junction Transistor (BJT), an Insulated Gate Bipolar Transistor (IGBT), a high-electron-mobility transistor (HEMT), a Wide Band Gap (WBG) semiconductor, a power module, a gate driver, a component such as a General-Purpose Broadband component, a Telecom component, a L-Band component, a S-Band component, a X-Band component, a C-Band component, a Ku-Band component, a Satellite Communications component, and/or the like. The other components 200 may be implemented as a radio frequency device may be configured to, may support, or the like transmitting a radio wave and modulating that wave to carry data with allowable transmitter power output, harmonics, and/or band edge requirements. The other components 200 implemented as a radio frequency device may be configured to, may support, or the like receiving a radio wave and demodulating the radio wave. The other components 200 may be implemented as a radio frequency device may be configured to, may support, or the like transmitting a radio wave and modulating that wave to carry data with allowable transmitter power output, harmonics, and/or band edge requirements; and may be configured to, may support, or the like receiving a radio wave and demodulating the radio wave.

In aspects, the connection 410 is configured as one of the following: a spot welded portion, a laser beam modified portion, a laser beam welded portion, an ultrasonic welded portion, an electric resistance welded portion, and a fused metal welded portion. In aspects, the connection 410 is arranged on a surface of said metal submount 102. In aspects, the connection 410 comprises materials of the metal submount 102 and a flag portion 406. In aspects, the connection 410 comprises materials of the metal submount 102 and a portion of a lead frame 408. In aspects, the one or more metal contacts 404 are configured to be located adjacent said metal submount 102 by a lead frame 408 attached to the metal submount 102 by the connection 410. In aspects, the flag portion 406 and the connection 410 connects the flag portion 406 to a surface of said metal submount 102. In aspects, the flag portion 406 is configured to locate the one or more metal contacts 404 adjacent said metal submount 102 by a lead frame 408 and the flag portion 406 is configured to be subsequently detached from the lead frame 408. In aspects, the metal submount 102 is free of rivets.

Accordingly, the disclosure has provided a package implementing component connections having more efficient use of space, a package implementing less costly manufacturing processes, a package implementing less time consuming manufacturing processes, and/or the like.

The following are a number of nonlimiting EXAMPLES of aspects of the disclosure. One EXAMPLE includes: EXAMPLE 1. A semiconductor package that includes a metal submount; at least one transistor die arranged on said metal submount; and one or more metal contacts configured to be located adjacent said metal submount by a connection, where the connection is configured as one of the following: a spot welded portion, a laser beam modified portion, a laser beam welded portion, an ultrasonic welded portion, an electric resistance welded portion, and a fused metal welded portion.

The above-noted EXAMPLE may further include any one or a combination of more than one of the following EXAMPLES: 2. The semiconductor package according to any EXAMPLE herein where the connection is arranged on a surface of said metal submount. 3. The semiconductor package according to any EXAMPLE herein where the connection includes materials of the metal submount and a flag portion. 4. The semiconductor package according to any EXAMPLE herein where the connection includes materials of the metal submount and a portion of a lead frame. 5. The semiconductor package according to any EXAMPLE herein where the one or more metal contacts are configured to be located adjacent said metal submount by a lead frame attached to the metal submount by the connection. 6. The semiconductor package according to any EXAMPLE herein includes a flag portion and the connection connects the flag portion to a surface of said metal submount. 7. The semiconductor package according to any EXAMPLE herein where the flag portion is configured to locate the one or more metal contacts adjacent said metal submount by a lead frame; and where the flag portion is configured to be subsequently detached from the lead frame. 8. The semiconductor package according to any EXAMPLE herein where the metal submount is free of rivets. 9. The semiconductor package according to any EXAMPLE herein includes an overmold member arranged on the metal submount, where the one or more metal contacts extend within and outside the overmold member. 10. The semiconductor package according to any EXAMPLE herein where the at least one transistor die includes one or multiple LDMOS transistor die. 11. The semiconductor package according to any EXAMPLE herein where the at least one transistor die includes one or multiple GaN based HEMTs. 12. The semiconductor package according to any EXAMPLE herein where at least one of the one or multiple GaN based HEMTs includes a silicon carbide substrate. 13. The semiconductor package according to any EXAMPLE herein where the semiconductor package includes a plurality of the at least one transistor die. 14. The semiconductor package according to any EXAMPLE herein where the plurality of the at least one transistor die are configured in a Doherty configuration.

One EXAMPLE includes: EXAMPLE 15. A semiconductor package that includes a metal submount; at least one transistor die arranged on said metal submount; and one or more metal contacts configured to be located adjacent said metal submount by a connection, where the one or more metal contacts are configured to be located adjacent said metal submount by a lead frame fused to the metal submount by the connection.

The above-noted EXAMPLE may further include any one or a combination of more than one of the following EXAMPLES: 16. The semiconductor package according to any EXAMPLE herein where the connection is arranged on a surface of said metal submount. 17. The semiconductor package according to any EXAMPLE herein where the connection includes materials of the metal submount and a flag portion. 18. The semiconductor package according to any EXAMPLE herein where the connection includes materials of the metal submount and a portion of a lead frame. 19. The semiconductor package according to any EXAMPLE herein where the connection is configured as one of the following: a spot welded portion, a laser beam modified portion, a laser beam welded portion, an ultrasonic welded portion, an electric resistance welded portion, and a fused metal welded portion. 20. The semiconductor package according to any EXAMPLE herein includes a flag portion and the connection connects the flag portion to a surface of said metal submount. 21. The semiconductor package according to any EXAMPLE herein where the flag portion is configured to locate the one or more metal contacts adjacent said metal submount by a lead frame; and where the flag portion is configured to be subsequently detached from the lead frame. 22. The semiconductor package according to any EXAMPLE herein where the metal submount is free of rivets. 23. The semiconductor package according to any EXAMPLE herein includes an overmold member arranged on the metal submount, where the one or more metal contacts extend within and outside the overmold member. 24. The semiconductor package according to any EXAMPLE herein where the at least one transistor die includes one or multiple LDMOS transistor die. 25. The semiconductor package according to any EXAMPLE herein where the at least one transistor die includes one or multiple GaN based HEMTs. 26. The semiconductor package according to any EXAMPLE herein where at least one of the one or multiple GaN based HEMTs includes a silicon carbide substrate. 27. The semiconductor package according to any EXAMPLE herein where the semiconductor package includes a plurality of the at least one transistor die. 28. The semiconductor package according to any EXAMPLE herein where the plurality of the at least one transistor die are configured in a Doherty configuration.

One EXAMPLE includes: EXAMPLE 29. A process of implementing a semiconductor package that includes providing a metal submount; arranging at least one transistor die on said metal submount; configuring one or more metal contacts to be located adjacent said metal submount by a connection; and forming the connection as one of the following: a spot welded portion, a laser beam modified portion, a laser beam welded portion, an ultrasonic welded portion, an electric resistance welded portion, and a fused metal welded portion.

The above-noted EXAMPLE may further include any one or a combination of more than one of the following EXAMPLES: 30. The process of implementing a semiconductor package according to any EXAMPLE herein where the connection is arranged on a surface of said metal submount. 31. The process of implementing a semiconductor package according to any EXAMPLE herein where the connection includes materials of the metal submount and a flag portion. 32. The process of implementing a semiconductor package according to any EXAMPLE herein where the connection includes materials of the metal submount and a portion of a lead frame. 33. The process of implementing a semiconductor package according to any EXAMPLE herein where the one or more metal contacts are configured to be located adjacent said metal submount by a lead frame attached to the metal submount by the connection. 34. The process of implementing a semiconductor package according to any EXAMPLE herein includes providing a flag portion and configuring the connection to connect the flag portion to a surface of said metal submount. 35. The process of implementing a semiconductor package according to any EXAMPLE herein where the flag portion is configured to locate the one or more metal contacts adjacent said metal submount by a lead frame; and where the flag portion is configured to be subsequently detached from the lead frame. 36. The process of implementing a semiconductor package according to any EXAMPLE herein where the metal submount is free of rivets. 37. The process of implementing a semiconductor package according to any EXAMPLE herein includes arranging an overmold member on the metal submount, where the one or more metal contacts extend within and outside the overmold member. 38. The process of implementing a semiconductor package according to any EXAMPLE herein where the at least one transistor die includes one or multiple LDMOS transistor die. 39. The process of implementing a semiconductor package according to any EXAMPLE herein where the at least one transistor die includes one or multiple GaN based HEMTs. 40. The process of implementing a semiconductor package according to any EXAMPLE herein where at least one of the one or multiple GaN based HEMTs includes a silicon carbide substrate. 41. The process of implementing a semiconductor package according to any EXAMPLE herein where the process of implementing a semiconductor package includes a plurality of the at least one transistor die. 42. The process of implementing a semiconductor package according to any EXAMPLE herein where the plurality of the at least one transistor die are configured in a Doherty configuration.

The adhesive of the disclosure may be utilized in an adhesive bonding process that may include applying an intermediate layer to connect surfaces to be connected. The adhesive may be organic or inorganic; and the adhesive may be deposited on one or both surfaces of the surface to be connected. The adhesive may be utilized in an adhesive bonding process that may include applying adhesive material with a particular coating thickness, at a particular bonding temperature, for a particular processing time while in an environment that may include applying a particular tool pressure. In one aspect, the adhesive may be a conductive adhesive, an epoxy-based adhesive, a conductive epoxy-based adhesive, and/or the like.

The solder of the disclosure may be utilized to form a solder interface that may include solder and/or be formed from solder. The solder may be any fusible metal alloy that may be used to form a bond between surfaces to be connected. The solder may be a lead-free solder, a lead solder, a eutectic solder, or the like. The lead-free solder may contain tin, copper, silver, bismuth, indium, zinc, antimony, traces of other metals, and/or the like. The lead solder may contain lead, other metals such as tin, silver, and/or the like. The solder may further include flux as needed.

The sintering of the disclosure may utilize a process of compacting and forming a conductive mass of material by heat and/or pressure. The sintering process may operate without melting the material to the point of liquefaction. The sintering process may include sintering of metallic nano or hybrid powders in pastes or epoxies. The sintering process may include sintering in a vacuum. The sintering process may include sintering with the use of a protective gas.

The eutectic bonding of the disclosure may utilize a eutectic soldering process that may form a eutectic system. The eutectic system may be used between surfaces to be connected. The eutectic bonding may utilize metals that may be alloys and/or intermetallics that transition from solid to liquid state, or from liquid to solid state, at a specific composition and temperature. The eutectic alloys may be deposited by sputtering, evaporation, electroplating, and/or the like.

The ultrasonically welding of the disclosure may utilize a process whereby high-frequency ultrasonic acoustic vibrations are locally applied to components being held together under pressure. The ultrasonically welding may create a solid-state weld between surfaces to be connected. In one aspect, the ultrasonically welding may include applying a sonicated force.

While the disclosure has been described in terms of exemplary aspects, those skilled in the art will recognize that the disclosure can be practiced with modifications in the spirit and scope of the appended claims. These examples given above are merely illustrative and are not meant to be an exhaustive list of all possible designs, aspects, applications or modifications of the disclosure.

What is claimed is:

1. A semiconductor package comprising:

a metal submount comprising opposing ends, opposing sides, and an upper surface that extends between the opposing ends and the opposing sides;

at least one transistor die arranged on said metal submount;

a lead frame portion attached to the metal submount by a connection; and one or more metal contacts configured to be located adjacent said metal submount at least by the lead frame portion and the one or more metal contacts extending from one or more of the opposing ends, wherein the connection is configured as one of the following: a spot welded portion, a laser beam modified portion, a laser beam welded portion, an ultrasonic welded portion, an electric resistance welded portion, and a fused metal welded portion;

wherein the lead frame portion comprises a flag portion extending from one or more of the opposing sides and the flag portion comprising an inside portion and an outside portion; and wherein the connection connects the inside portion of the flag portion to the upper surface of said metal submount.

2. The semiconductor package according to claim 1 wherein the connection is arranged on the upper surface of said metal submount;

wherein the connection is configured as a joint comprising materials of the metal submount and the flag portion; and wherein the lead frame portion comprises an extension of a lead frame.

3. The semiconductor package according to claim 1 wherein the connection is configured as a joint that comprises materials of the metal submount and the lead frame portion;

wherein the one or more metal contacts comprise at least two metal contacts that extend in opposite directions from the opposing ends; and wherein the lead frame portion is between the at least two metal contacts.

4. The semiconductor package according to claim 1 wherein the one or more metal contacts are configured to be located adjacent said metal submount by a lead frame attached to the metal submount by the lead frame portion and the connection.

5. The semiconductor package according to claim 1 wherein the flag portion is configured to locate the one or more metal contacts adjacent said metal submount by a lead frame;

wherein the one or more metal contacts comprise at least two metal contacts that extend in opposite directions from the opposing ends;

wherein the flag portion is between the at least two metal contacts; and wherein the flag portion is configured to be subsequently detached from the lead frame.

6. The semiconductor package according to claim 1 wherein the metal submount is free of rivets.

7. The semiconductor package according to claim 1 further comprising an overmold member arranged on the metal submount, wherein the one or more metal contacts extend within and outside the overmold member.

8. The semiconductor package according to claim 1 wherein the at least one transistor die comprises one or multiple LDMOS transistor die.

9. The semiconductor package according to claim 1 wherein the at least one transistor die comprises one or multiple GaN based HEMTs.

10. The semiconductor package according to claim 9 wherein at least one of the one or multiple GaN based HEMTs comprise a silicon carbide substrate.

11. The semiconductor package according to claim 1 wherein the semiconductor package comprises a plurality of transistor dies.

12. The semiconductor package according to claim 11 wherein the plurality of transistor dies are configured in a Doherty configuration.

13. A semiconductor package comprising:

a metal submount comprising opposing ends, opposing sides, and an upper surface that extends between the opposing ends and the opposing sides;

at least one transistor die arranged on said metal submount;

a lead frame portion attached to the metal submount by a connection; and one or more metal contacts configured to be located adjacent said metal submount at least by the lead frame portion and the one or more metal contacts extending over one or more of the opposing ends, wherein the connection is configured as one of the following: a spot welded portion, a laser beam modified portion, a laser beam welded portion, an ultrasonic welded portion, an electric resistance welded portion, and a fused metal welded portion;

wherein the lead frame portion comprises a flag portion extending over one or more of the opposing sides and the flag portion;

wherein the connection comprises materials of the metal submount and the flag portion; and wherein the flag portion comprises an extension of a lead frame.

14. A process of implementing a semiconductor package, comprising:

providing a metal submount that comprises opposing ends, opposing sides, and an upper surface that extends between the opposing ends and the opposing sides;

arranging at least one transistor die on said metal submount;

attaching a lead frame portion to the metal submount by a connection;

configuring one or more metal contacts to be located adjacent said metal submount at least by the lead frame portion and the one or more metal contacts extending from one or more of the opposing ends; and forming the connection as one of the following: a spot welded portion, a laser beam modified portion, a laser beam welded portion, an ultrasonic welded portion, an electric resistance welded portion, and a fused metal welded portion, wherein the lead frame portion comprises a flag portion extending from one or more of the opposing sides and the flag portion comprising an inside portion and an outside portion and the process further comprising configuring the connection to connect the flag portion to the upper surface of said metal submount.

15. The process of implementing a semiconductor package according to claim 14 wherein the connection is arranged on the upper surface of said metal submount;

wherein the connection is configured as a joint comprising materials of the metal submount and the flag portion; and wherein the lead frame portion comprises an extension of a lead frame.

16. The process of implementing a semiconductor package according to claim 14 wherein the connection comprises materials of the metal submount and the flag portion; and wherein the flag portion comprises an extension of a lead frame.

17. The process of implementing a semiconductor package according to claim 14 wherein the connection comprises materials of the metal submount and the lead frame portion;

wherein the one or more metal contacts comprise at least two metal contacts that extend in opposite directions from the opposing ends; and wherein the lead frame portion is between the at least two metal contacts.

18. The process of implementing a semiconductor package according to claim 14 wherein the one or more metal contacts are configured to be located adjacent said metal submount by a lead frame attached to the metal submount by the lead frame portion and the connection.

19. The process of implementing a semiconductor package according to claim 14 wherein the flag portion is configured to locate the one or more metal contacts adjacent said metal submount by a lead frame;

wherein the one or more metal contacts comprise at least two metal contacts that extend in opposite directions from the opposing ends;

wherein the flag portion is between the at least two metal contacts; and wherein the flag portion is configured to be subsequently detached from the lead frame.

20. The process of implementing a semiconductor package according to claim 14 wherein the metal submount is free of rivets.

21. The process of implementing a semiconductor package according to claim 14 further comprising arranging an overmold member on the metal submount, wherein the one or more metal contacts extend within and outside the overmold member.

22. The process of implementing a semiconductor package according to claim 14 wherein the at least one transistor die comprises one or multiple LDMOS transistor die.

23. The process of implementing a semiconductor package according to claim 14 wherein the at least one transistor die comprises one or multiple GaN based HEMTs.

24. The process of implementing a semiconductor package according to claim 23 wherein at least one of the one or multiple GaN based HEMTs comprise a silicon carbide substrate.

25. The process of implementing a semiconductor package according to claim 14 wherein the process of implementing a semiconductor package comprises a plurality of transistor dies.

26. The process of implementing a semiconductor package according to claim 25 wherein the plurality transistor dies are configured in a Doherty configuration.

* * * * *